United States Patent [19]
Wada et al.

[11] Patent Number: 5,793,670
[45] Date of Patent: Aug. 11, 1998

[54] STATIC SEMICONDUCTOR MEMORY DEVICE INCLUDING A BIPOLAR TRANSISTOR IN A MEMORY CELL, SEMICONDUCTOR DEVICE INCLUDING BIPOLAR TRANSISTORS AND METHOD OF MANUFACTURING BIPOLAR TRANSISTORS

[75] Inventors: Tomohisa Wada; Hirotoshi Sato; Hiroki Honda, all of Hyogo, Japan

[73] Assignee: Mitsubishi Denki Kabushiki Kaisha, Tokyo, Japan

[21] Appl. No.: 734,333

[22] Filed: Oct. 21, 1996

[30] Foreign Application Priority Data

Apr. 4, 1996 [JP] Japan ................ 8-082530

[51] Int. Cl.$^6$ .................................... G11C 11/00
[52] U.S. Cl. ............... 365/154; 365/156; 365/177; 257/205; 257/478
[58] Field of Search ................ 365/154, 156, 365/177; 257/54, 205, 477, 478

[56] References Cited

U.S. PATENT DOCUMENTS

| | | | |
|---|---|---|---|
| 4,839,862 | 6/1989 | Shiba et al. | 365/154 |
| 4,868,628 | 9/1989 | Simmons. | |
| 4,903,090 | 2/1990 | Yokoyama | 257/477 X |
| 5,363,325 | 11/1994 | Sumouchi et al. | 365/177 X |
| 5,483,483 | 1/1996 | Choi et al. | |

OTHER PUBLICATIONS

Tomohisa Wada, et al: "A 34-ns 1-Mbit CMOS SRAM Using Triple Polysilicon" *IEEE Journal of Solid-State Circuits*, vol. SC22, No. 5, Oct. 1987, pp. 727-732.

Katsuro Sasaki, et al: "A 9-ns 1-Mbit CMOS SRAM", *IEEE Journal of Solid-State Circuits*, vol. 24, No. 5, Oct. 1989, pp. 1219-1225.

*Primary Examiner*—Huan Hoang
*Attorney, Agent, or Firm*—McDermott, Will & Emery

[57] ABSTRACT

A memory cell includes first and second driver transistors, first and second access transistors and first and second load elements, and in addition, first and second bipolar transistors. Accordingly, static noise margin is enlarged. The first bipolar transistor has its emitter formed in one of the source/drain regions of the first access transistor. The collector of the first bipolar transistor is the backgate terminal of the first access transistor. One of the source/drain regions of the first access transistor functions as the base of the first bipolar transistor. The same applies to the second bipolar transistor and the second access transistor. As the memory cell is structured in the above described manner, lower power supply potential can be used without the problem of latch up or increased area.

10 Claims, 19 Drawing Sheets

STATIC SEMICONDUCTOR MEMORY DEVICE INCLUDING A BIPOLAR TRANSISTOR IN A MEMORY CELL, SEMICONDUCTOR DEVICE INCLUDING BIPOLAR TRANSISTORS AND METHOD OF MANUFACTURING BIPOLAR TRANSISTORS

BACKGROUND OF THE INVENTION

1. Field of the Invention

The present invention relates to a static semiconductor memory device, a semiconductor device and a method of manufacturing a bipolar transistor. More specifically, the present invention relates to a static semiconductor memory device which realizes lower power supply potential and higher speed of operation, a semiconductor device which allows lower power supply potential and to a method of manufacturing a bipolar transistor which realizes lower power supply potential.

2. Description of the Background Art

As an example of a conventional static semiconductor memory device, a static random access memory (hereinafter referred to as an "SRAM") will be described. FIG. 25 is a circuit diagram showing details of a conventional SRAM memory cell.

Referring to FIG. 25, the memory cell of the conventional SRAM includes driver transistors Q1 and Q2, access transistors Q3 and Q4, and high resistance elements R1 and R2. Driver transistors Q1 and Q2 as well as access transistors Q3 and Q4 are NMOS transistors. High resistance elements R1 and R2 are used as load elements of the memory cell.

Driver transistor Q1 has its gate connected to the drain (storage node N2) of driver transistor Q2, and driver transistor Q2 has its gate connected to the drain (storage node N1) of driver transistor Q1. More specifically, these are cross coupled to form a latch circuit. Access transistor Q3 is connected between a bit line BL and storage node N1, and it has its gate connected to a word line WL. Access transistor Q4 is connected between a bit line /BL and storage node N2, and it has its gate connected to word line WL. High resistance element R1 is connected between a node having a power supply potential Vcc and storage node N1. High resistance element R2 is connected between a node having the power supply potential Vcc and storage node N2. Such a memory cell is generally referred to as a high resistance load type memory cell.

Driver transistors Q1 and Q2 as well as access transistors Q3 and Q4 are formed on a main surface of a silicon substrate, not shown. On an upper layer of the main surface, load elements (high resistance elements R1 and R2) of the high resistance load type memory cell are formed by polycrystalline silicon (hereinafter referred to as polysilicon), not shown, with an insulating layer interposed. The load elements are formed in this manner to reduce the area of the memory cell. A conventional SRAM in which load elements are formed on an upper layer of the transistor in the high resistance load type memory cell is disclosed, for example, in "A 34-ns 1-Mbit CMOS SRAM Using Triple Polysilicon", IEEE Journal of Solid-State Circuits, Vol-SC22, No. 5, October 1987, pp. 727–732.

FIG. 26 shows details of another memory cell of a conventional SRAM. Portions similar to those of FIG. 25 are denoted by the same reference characters and description thereof is not repeated.

Referring to FIG. 26, the memory cell of the conventional SRAM includes driver transistors Q1 and Q2, access transistors Q3 and Q4, and PMOS transistors Q5 and Q6. PMOS transistor Q5 is connected between a node having the power supply potential Vcc and storage node N1, and has its gate connected to storage node N2. PMOS transistor Q6 is connected between a node having the power supply potential Vcc and storage node N2, and has its gate connected to storage node N1. PMOS transistors Q5 and Q6 are used as load elements for the memory cell. Such a memory cell is generally referred to as a CMOS type memory cell.

PMOS transistors Q5 and Q6 as load elements are implemented by thin film transistors. The thin film transistors are formed on an upper layer of the main surface of a silicon substrate, not shown, where transistors Q1 to Q4 are formed, with an insulating film, not shown, interposed. A memory cell using thin film transistors as load elements is disclosed, for example, in "A 9-ns 1-Mbit CMOS SRAM", IEEE Journal of Solid-State Circuits, Vol-24, No. 5, October 1989, pp. 1219–1225.

FIG. 27 is a plan view of the high resistance load type memory cell shown in FIG. 25, showing up to the gates (first polysilicon) of driver transistors Q1 and Q2 and of access transistors Q3 and Q4.

Referring to FIG. 27, active layers 9a and 9b are formed on the main surface of a silicon substrate, not shown. First polysilicons 7a, 7b, 7c and 7d are formed on active layers 9a and 9b. Active layer 9a and first polysilicon 7c are connected by a first buried contact 11a. Active layer 9b and first polysilicon 7b are connected by a first buried contact 11b. The first buried contacts 11a and 11b are formed by opening holes in an insulating layer (gate oxide film), not shown, formed on the surfaces of active layers 9a and 9b.

Access transistor Q4 is formed using first polysilicon 7a as the gate and active layer 9a as the source and drain. The portion where first polysilicon 7a and active layer 9a are overlapped defines a channel region of access transistor Q4. Driver transistor Q1 is formed using first polysilicon 7c as the gate and active layer 9b as the source and drain. The portion where active layer 9b and first polysilicon 7c are overlapped defines the channel region of driver transistor Q1. Access transistor Q3 is formed using first polysilicon 7b as the gate and active layer 9b as the source and drain. The portion where first polysilicon 7b and active layer 9b are overlapped is the channel region. Driver transistor Q2 is formed using first polysilicon 7d as the gate and active layer 9a as the source and drain. The portions where the first polysilicon 7d and active layer 9a are overlapped is the channel region.

FIG. 28 is a plan view of the high resistance load type memory cell shown in FIG. 25, showing up to high resistance elements R1 and R2. Portions similar to those of FIG. 27 are denoted by the same reference characters and description thereof is not repeated.

Referring to FIG. 28, a second polysilicon 15 is formed on first polysilicons 7c and 7d. The second polysilicon 15 is used as a ground line, for supplying the ground potential GND to the memory cell. The second polysilicon 15 is connected to an active layer, not shown, by second buried contacts 13c and 13d. Third polysilicons 17a and 17b are formed on second polysilicon 15. The third polysilicon 17b and the first polysilicon 7c are connected by a first contact hole 18a. First polysilicon 7d and third polysilicon 17a are connected by a first contact hole 18b.

FIG. 29 is a plan view of the high resistance load type memory cell shown in FIG. 25, showing up to the bit line (metal interconnection). Portions similar to those of FIG. 28 are denoted by the same reference characters and description thereof is not repeated.

Referring to FIG. 29, ions are implanted to the third polysilicons 17a and 17b, using a pattern 21 as a mask. Accordingly, portions which are not covered by pattern 21 of third polysilicons 17a and 17b, that is, portions which are subjected to ion implantation, come to have lower resistance values. Of the third polysilicons 17a and 17b, portions which come to have lower resistance values are used as interconnections for supplying the power supply potential Vcc. Meanwhile, of the third polysilicons 17a and 17b, portions covered by pattern 21 have high resistance. The third polysilicon 17b having the high resistance is the high resistance element R2 which serves as the load element of the memory cell. The third polysilicon 17a having high resistance is the high resistance element R1 serving as the load element of the memory cell.

Metal interconnections 23a and 23b are formed on third polysilicons 17a and 17b. Metal interconnection 23a is connected to an active layer, not shown, by a second contact hole 19c. Metal interconnection 23b is connected to an active layer, not shown, by a second contact hole 19d. Metal interconnection 23a is used as bit line/BL. Metal interconnection 23b is used as bit line BL.

FIG. 30 is a cross section taken along the lines AA' and BB' of the plan view of FIG. 29. Portions similar to those of FIGS. 27 to 29 are denoted by the same reference characters and description thereof is not repeated.

In the following, description will be given assuming that the cross section of FIG. 30 is taken along the line BB' of FIG. 29. The cross section taken along the line AA' of FIG. 29 is similar to the cross section taken along the line BB' rotated by 180° about the center of the memory cell. Namely, the cross sections taken along the lines AA' and BB' are in rotational symmetry of 180°, with the center of the memory cell being the axis of rotation.

Referring to FIG. 30, a field oxide film 27 is formed on the main surface of silicon substrate 25. Portions not covered by field oxide film 27 serve as the silicon active layer (active regions). In the active layer (active regions) of silicon substrate 25, one and the other of the source/drain regions 9a1 and 9a2 of access transistor Q4 (FIG. 25) are formed. On the active layer between the source/drain regions 9a1 and 9a2, the first polysilicon 7a (gate of access transistor Q4) is formed, with an insulating layer (gate oxide film) not shown, interposed. The active layer immediately below the first polysilicon 7a is the channel region of access transistor Q4.

In the active layer of silicon substrate 25, an impurity region 9a3 is formed. The first polysilicon 7c is formed on impurity region 9a3 with an insulating film (gate oxide film), not shown, interposed. The first polysilicon 7c and impurity region 9a3 are connected by the first buried contact (corresponding to the first buried contact 11a of FIG. 27). The active layer immediately below the first polysilicon 7c where impurity region 9a3 is not formed is the channel region of driver transistor Q1. The first polysilicon 7b is formed on field oxide film 27. Since the first polysilicon 7b is formed on field oxide film 27, it simply serves as an interconnection. Here, the source/drain regions 9a1, 9a2, the active region (channel region) immediately below the first polysilicon 7a and impurity region 9a3 are parts of active layer 9a of FIG. 27. The active layer (channel layer of driver transistor Q1) immediately below the first polysilicon 7c is a part of the active layer 9b of FIG. 27.

On the first polysilicon 7a, a third polysilicon 17a is formed with an insulating layer, not shown, interposed. The second polysilicon 15 is formed on the first polysilicon 7c with an insulating layer, not shown, interposed. The third polysilicons 17b1, 17b2, 17b3 are formed on the second polysilicon 15 with an insulating layer, not shown, interposed. The third polysilicons 17b1 and 17b3 came to have lower resistance values because of ion implantation, which correspond to portions not covered by pattern 21 of the third polysilicon 17b. The third polysilicon 17b2 has high resistance, which corresponds to the portion covered by pattern 21 of the third polysilicon 17b shown in FIG. 29. The third polysilicon 17b2 corresponds to the high resistance element R2 (FIG. 25). Metal interconnection 23a is formed on the third polysilicons 17a and 17b1 to 17b3, with an insulating film, not shown, interposed. Metal interconnection 23a is connected to one of the source/drain regions 9a1 of access transistor Q4 through second contact hole 19c.

The third polysilicon 17b1 and the first polysilicon 17c are connected by the first contact hole 18a. The first polysilicon 7c serves as the gate of driver transistor Q1.

FIG. 31 shows transfer characteristic of the memory cell when the word line WL is at a selected state, in the conventional SRAM (with the power supply potential Vcc=3 V) shown in FIGS. 25 and 26. In FIG. 31, the ordinate represents the potential at storage node N1 of FIG. 25 or 26, and the abscissa represents the potential at storage node N2 of FIG. 25 or 26. A first problem of the conventional SRAM will be described with reference to FIGS. 25, 26 and 31.

In the figure, two points denoted by the arrow A are stable points. In order to ensure retention of data stored in the memory cell (that is, to prevent destruction of data stored in the memory cell), existence of these two stable points are necessary. By sufficiently enlarging the regions denoted by the arrow B (hereinafter referred to as "eyes of the memory cell"), these two stable points can be ensured. The eye of the memory cell is also referred to as a static noise margin. The inclination of the line denoted by the arrow C represents magnitude of the gain of the inverter in the memory cell. If the inclination of the line denoted by the arrow C is steep, the inverter of the memory cell has high gain, and when the inclination of the line is moderate, the inverter of the memory cell has low gain.

When the load elements of the memory cell are provided by high resistance elements R1 and R2 or thin film transistors Q5 and Q6, the on resistance of the load element is considerably larger than the on resistances of driver transistors Q1 and Q2 and access transistors Q3 and Q4. Therefore, when the word line WL is at a selected state, that is, when the power supply potential Vcc is being supplied to word line WL, the inverter of the memory cell comes to have low gain, and hence the eyes of the memory cell become smaller. Therefore, in order to ensure data retention of the memory cell, the following conditions must be satisfied in designing. Let us represent chancel width of driver transistors Q1 and Q2 by Wd (FIG. 27), the channel length by Ld (FIG. 27), the channel width of access transistors Q3 and Q4 by Wa (FIG. 27) and the channel length by La (FIG. 27). Here, in order to increase the gain and to enlarge the eyes of the memory cell, generally, it is necessary to set the value (Wd/Ld) to be at least third times the value (Wa/La). This means that area of driver transistors Q1 and Q2 are enlarged, hindering reduction in area of the memory cells. This is the first problem experienced by the conventional SRAM.

FIG. 32 shows the transfer characteristic of the memory cell when the word line WL is at the selected state in the conventional SRAM (with the power supply potential Vcc=2 V). The ordinate of FIG. 32 represents the potential at storage node N1 of FIG. 25 or 26, and the abscissa represents the potential at storage node N2 of FIG. 25 or 26. The second problem of the conventional SRAM will be described.

Referring to FIG. 32, in the conventional SRAM having the memory cell shown in FIG. 25 or 26, when a low power supply potential such as 2 V is used, the eyes of the memory cell disappear. Therefore, the two stable points (storage of 1 bit) disappear, and data retention fails. This is the second problem experienced by the conventional SRAM. In FIGS. 31 and 32, the dotted line denoted by the arrow D represents relation between the potentials of storage nodes N1 and N2, where the potentials of storage nodes N1 and N2 of FIG. 25 or 26 are equal to each other.

The third problem of the conventional SRAM will be described with reference to FIG. 26. In the conventional SRAM employing the memory cell shown in FIG. 26, in order to realize lower power supply potential, it is possible to form the PMOS transistors Q5 and Q6 used as load elements on the main surface of the silicon substrate, not shown. In this case, it is necessary to form PMOS transistors Q5 and Q6 and NMOS transistors (access transistors Q3, Q4 and driver transistors Q1 and Q2) adjacent to each other. This leads to generation of latch up and increase in memory cell area. This is the third problem. The latch up means a phenomenon in which power supply current is increased at power on of the parasitic PNPN structure.

SUMMARY OF THE INVENTION

The present invention was made to solve the above described problems, and its object is to provide a static semiconductor memory device which allows reduction in area of the memory cells.

Another object of the present invention is to provide a static semiconductor memory device in which power supply potential can be lowered without generating problems of latch up and increased memory cell area.

A still further object of the present invention is to provide a static semiconductor memory device which allows high speed reading.

A still further object of the present invention is to provide a semiconductor device which can realize lower power supply potential.

A still further object of the present invention is to provide a method of manufacturing a bipolar transistor which can realize lower power supply potential.

The static semiconductor memory device in accordance with a first aspect of the present invention includes a memory cell for storing information. The memory cell includes a first load element, a second load element, a first MOS transistor, a second MOS transistor, a first bipolar transistor, a second bipolar transistor, a third MOS transistor and a fourth MOS transistor. The first load element is provided between a node having a first power supply potential and a first storage node. The second load element is provided between a node having the first power supply potential and a second storage node. The first MOS transistor is provided between the first storage node and a node having a second power supply potential. The first MOS transistor has its gate connected to the second storage node. The second MOS transistor is provided between the second storage node and a node having the second power supply potential. The second MOS transistor has its gate connected to the first storage node. The first bipolar transistor is provided between one of a paired bit lines and a node having a third power supply potential. The second bipolar transistor is provided between the other one of the paired bit lines and a node having the third power supply potential. The third MOS transistor is provided between the base of the first bipolar transistor and the first storage node. The third MOS transistor has its gate connected to a word line. The fourth MOS transistor is provided between the base of the second bipolar transistor and the second storage node. The fourth MOS transistor has its gate connected to the word line.

As described above, in the static semiconductor memory device in accordance with the first aspect of the present invention, gain is increased by providing bipolar transistors so as to enlarge eyes of the memory cell, that is, static noise margin.

Accordingly, in the static semiconductor memory device in accordance with the first aspect of the present invention, the value (Wd/Ld)/(Wa/La) can be set to approximately equal to or smaller than 1, so that the area can be reduced. Further, lower power supply potential can be implemented without causing increase in area or latch up. In other words, the device is operable over a wide range of power supply potential.

Further, in the static semiconductor memory device in accordance with the first aspect of the present invention, at the time of reading, current flowing to the ground can be amplified by the first or the second bipolar transistor. Therefore, high speed reading becomes possible.

Further, in the static semiconductor memory device in accordance with the first aspect of the present invention, preferably, junction between the emitter and the base of each of the first and second bipolar transistors is a Schottky junction. Therefore, it is possible to cause a large emitter current to flow with small base-emitter voltage, which allows operation at a low power supply potential.

In the static semiconductor memory device in accordance with the first aspect of the present invention, preferably, the threshold voltage of the access transistors (third and fourth MOS transistors) is smaller in absolute value than the threshold voltage of driver transistors (first and second MOS transistors). Therefore, the eyes of the memory cell can further be enlarged (that is, the static noise margin can further be enlarged), so that lower power supply potential can be used.

The semiconductor device in accordance with the second aspect of the present invention includes a bipolar transistor. The bipolar transistor includes an emitter, a base and a collector. Junction between the emitter and the base is a Schottky junction.

In this manner, in the semiconductor device in accordance with the second aspect of the present invention, the bipolar transistor includes a Schottky junction. Therefore, it becomes possible to cause a large emitter current to flow with a small base-emitter voltage, and hence operation at a low power supply potential becomes possible.

The method of manufacturing a bipolar transistor in accordance with a third aspect relates to a method of manufacturing a bipolar transistor having an emitter, a base and a collector. The method of manufacturing the bipolar transistor includes the steps of forming a base at a main surface of a silicon substrate, forming a metal on the base surface, and causing reaction between the metal and the silicon serving as the base by heat treatment so as to form silicide. The silicide formed by heat treatment will be the emitter.

In the method of manufacturing a bipolar transistor in accordance with the third aspect of the present invention, the junction between the silicide serving as the emitter and the silicon serving as the base is a Schottky junction. Therefore, in the bipolar transistor manufactured by the method of the invention allows a large emitter current to flow with small base-emitter voltage, and hence operation at a low power supply potential is possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An SRAM as a static semiconductor memory device in accordance with the present invention will be described with reference to the figures.

(First Embodiment)

Figure 1:
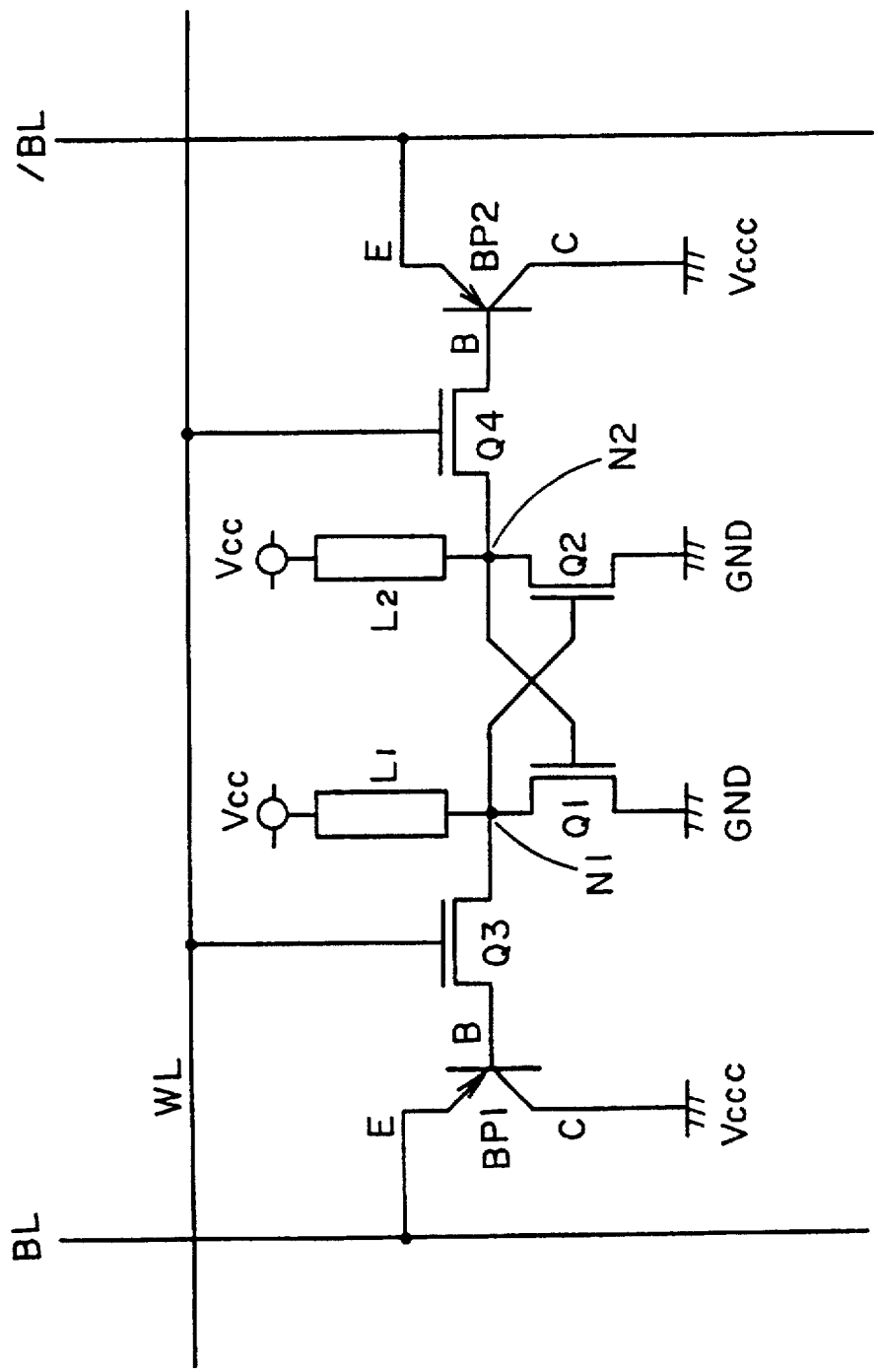
FIG. 1 is a circuit diagram showing details of the memory cell of the SRAM in accordance with a first embodiment of the present invention.

FIG. 1 is a circuit diagram showing details of the memory cell used in the SRAM in accordance with the first embodiment.

Referring to FIG. 1, the memory cell used for the SRAM in accordance with the first embodiment includes driver transistors Q1 and Q2, access transistors Q3 and Q4, bipolar transistors BP1 and BP2, and load elements L1 and L2. Driver transistor Q1 is connected between storage node N1 and a node having the ground potential GND, and it has its gate connected to storage node N2. Driver transistor Q2 is connected between storage node N2 and a node having the ground potential GND, and it has its gate connected to storage node N1. Load element L1 is connected between a node having the power supply potential Vcc and storage node N1. Load element L2 is connected between a node having the power supply potential Vcc and storage node N2. Access transistor Q3 is connected between the base B of bipolar transistor BP1 and storage node N1, and it has its gate connected to word line WL. Access transistor Q4 is connected between storage node N2 and the base B of bipolar transistor BP2, and it has its gate connected to word line WL. Bipolar transistor BP1 has its emitter E connected to bit line BL, its base B connected to access transistor Q3, and its connector C connected to the node having the collector power supply potential Vccc. Bipolar transistor BP2 has its emitter E connected to bit line /BL, its base B connected to access transistor Q4, and its collector C connected to the node having the collector power supply potential Vccc.

Figure 25:
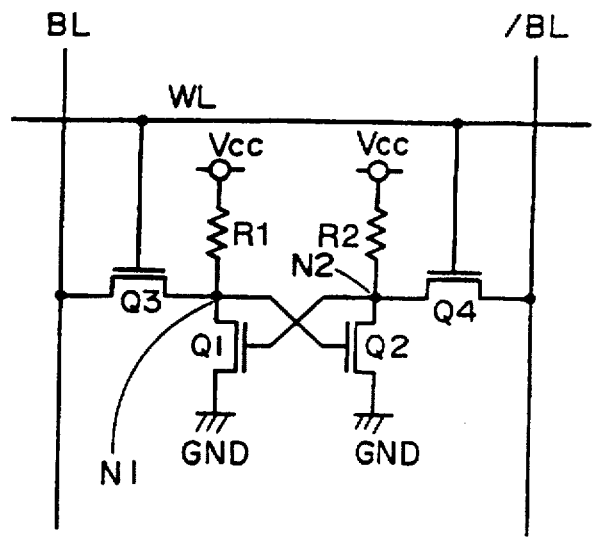
FIG. 25 is a circuit diagram showing details of the memory cell of the conventional SRAM.
Figure 26:
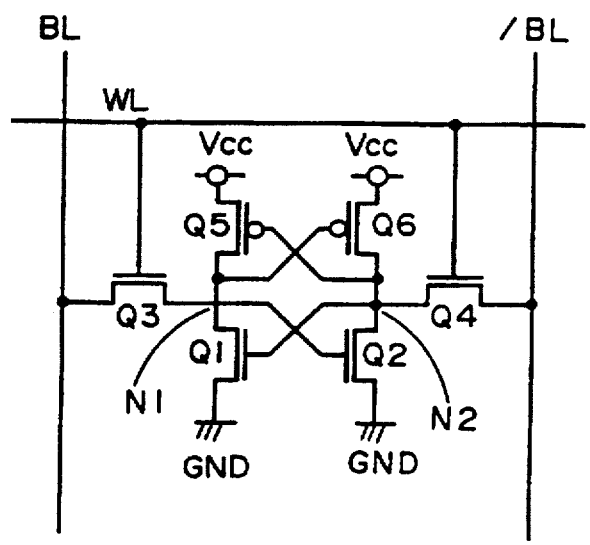
FIG. 26 is a circuit diagram showing details of another memory cell of the conventional SRAM.
Figure 27:
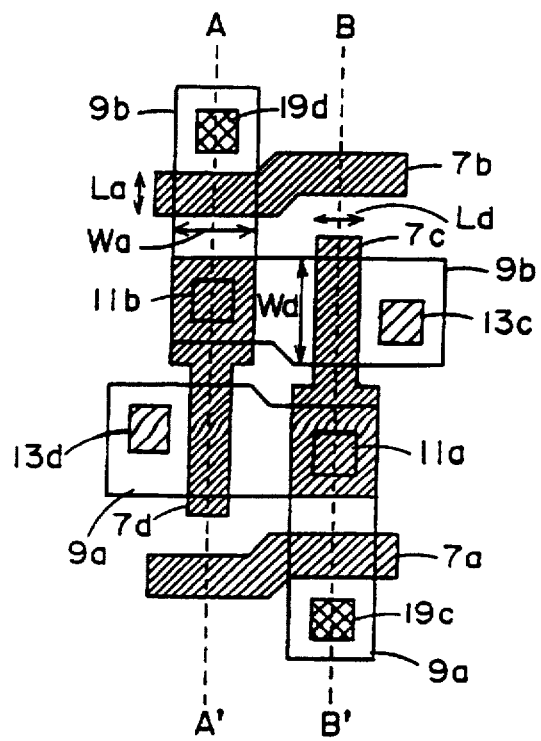
FIG. 27 is a plan view showing up to the gates of driver transistors Q1 and Q2 and of access transistors Q3 and Q4 of the memory cell shown in FIG. 25.
Figure 28:
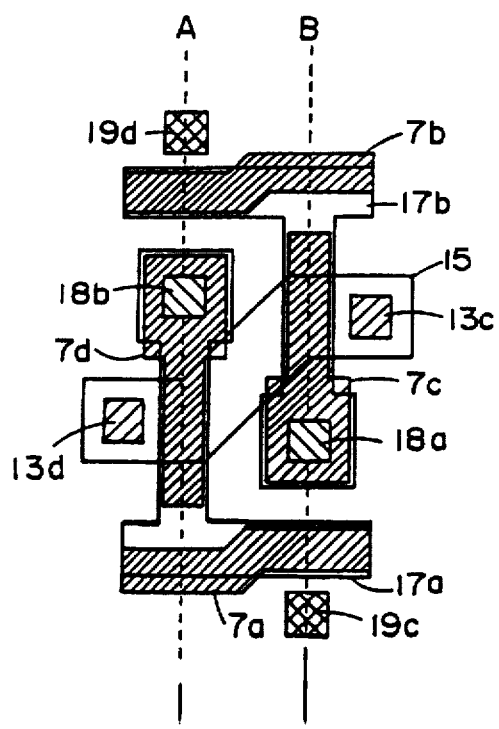
FIG. 28 is a plan view showing up to the high resistance elements R1 and R2 of the memory cell of FIG. 25.
Figure 29:
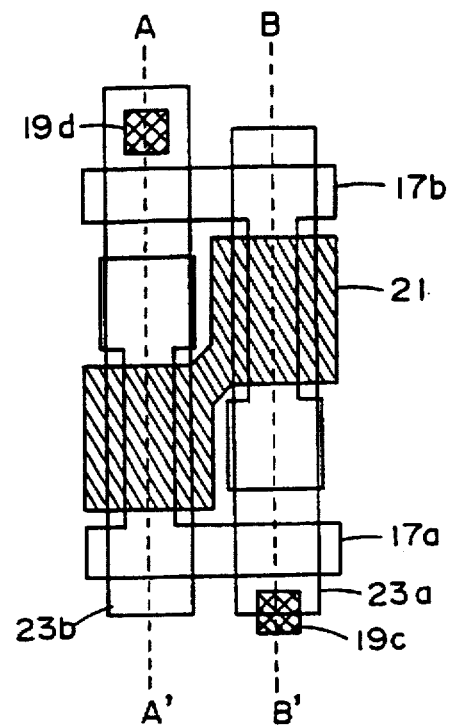
FIG. 29 is a plan view showing up to the bit line pair BL, /BL connected to the memory cell of FIG. 25.
Figure 30:
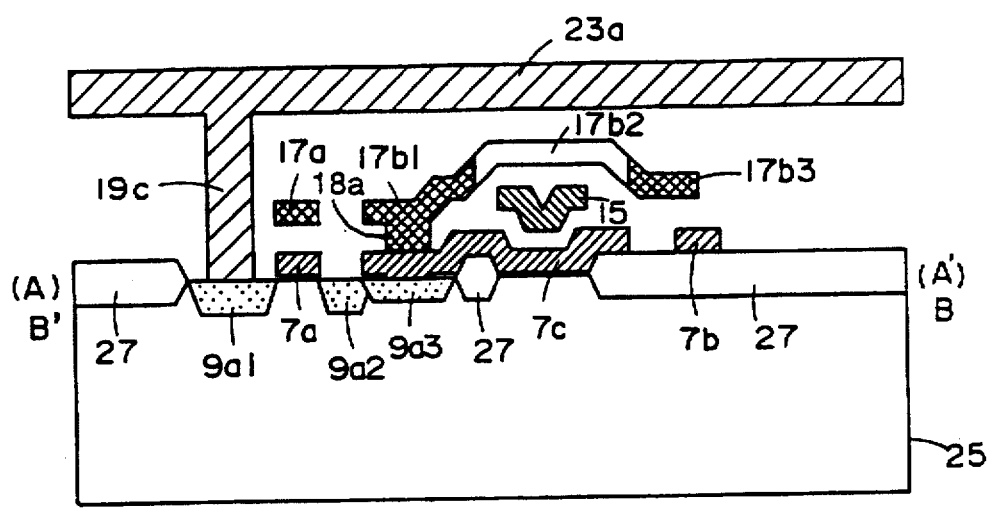
FIG. 30 is a cross section taken along the lines AA' and BB' of FIG. 29.
Figure 31:
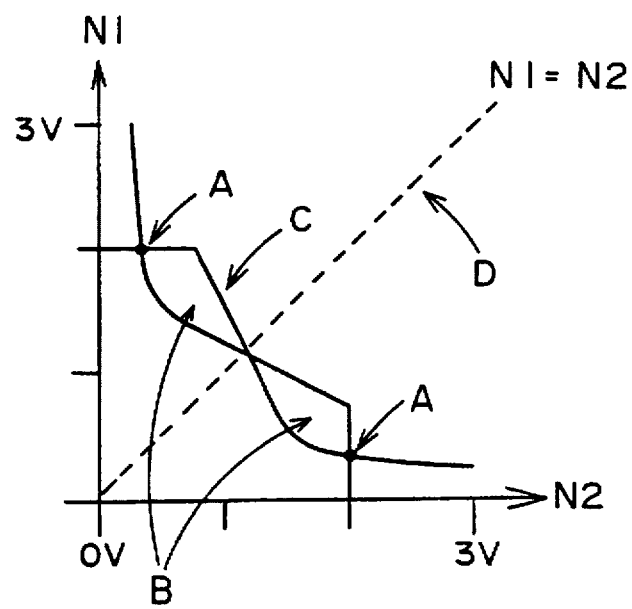
FIG. 31 shows transfer characteristic of the memory cell when the word line of the conventional SRAM is at the selected state, with the power supply potential of 3 V.
Figure 32:
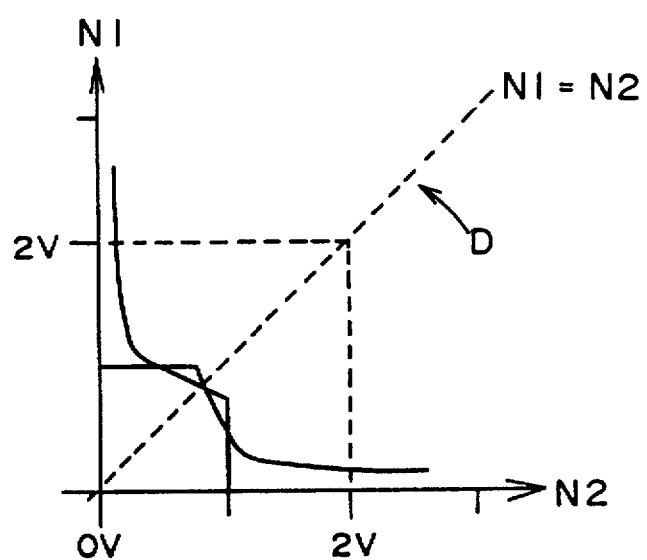
FIG. 32 shows transfer characteristic of the memory cell when the word line of the conventional SRAM is at the selected state, with the power supply potential of 2 V.

As load elements L1 and L2, high resistance elements R1 and R2 shown in FIG. 25 or PMOS transistors (thin film transistors) Q5 and Q6 shown in FIG. 26 may be used. In the following, an example in which high resistance elements are used as load elements L1 and L2 will be described. The collector power supply potential Vccc supplied to the collectors C of bipolar transistors BP1 and BP2 is the backgate potential of the driver transistors Q1 and Q2 and access transistors Q3 and Q4. The backgate potential (collector power supply potential Vccc) is at the ground potential GND, which is the source potential of driver transistors Q1 and Q2. It is possible to set the backgate potential (collector power supply potential Vccc) to a potential lower (negative) than the ground potential GND. Driver transistors Q1 and Q2 and access transistors Q3 and Q4 are NMOS transistors. Bipolar transistors BP1 and BP2 are of PNP type.

Figure 2:
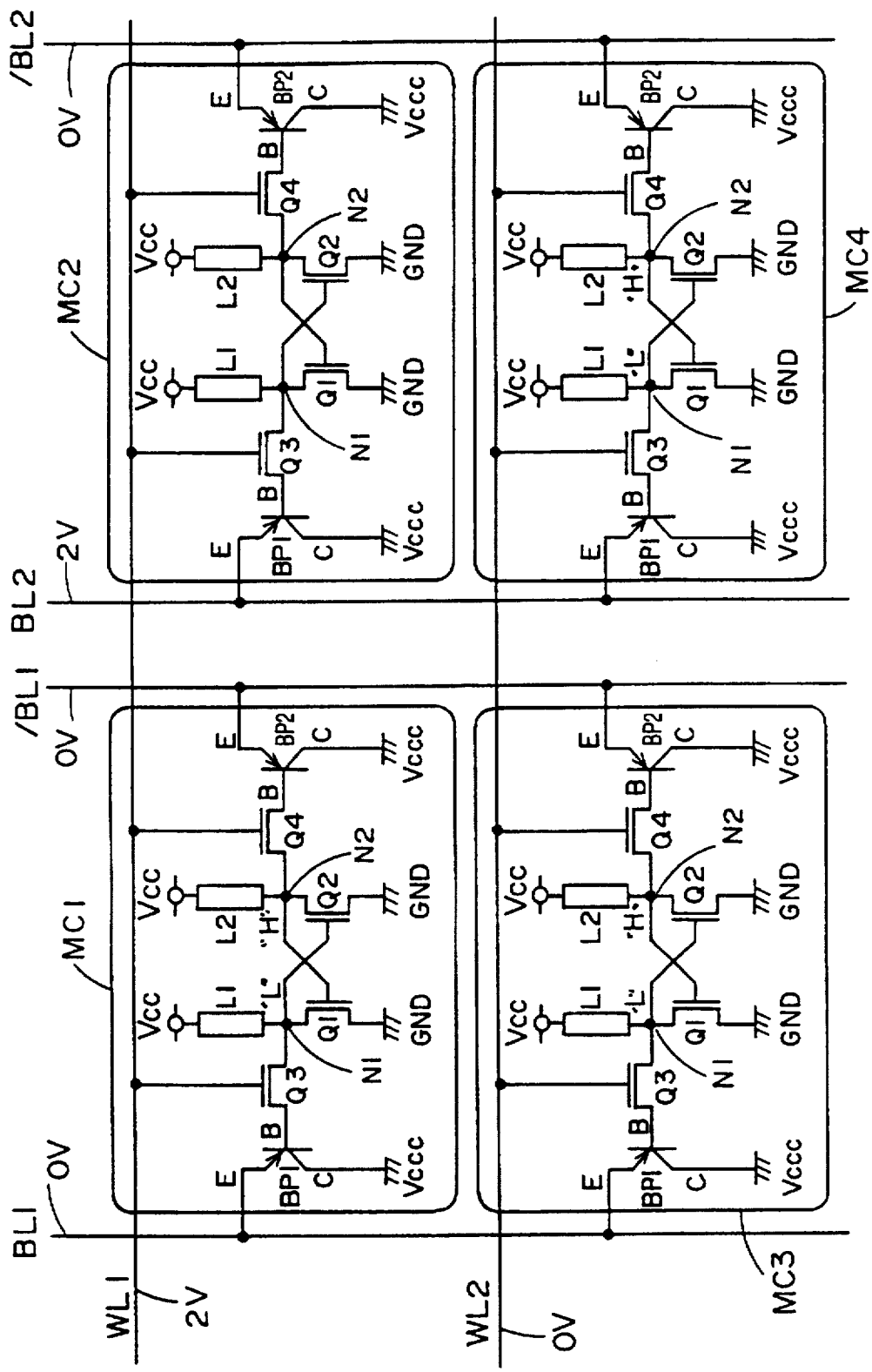
FIG. 2 shows writing operation of the SRAM in accordance with the first embodiment of the present invention.

FIG. 2 shows writing operation to the memory cells of the SRAM in accordance with the first embodiment of the present invention. Portions similar to those of FIG. 1 are denoted by the same reference characters and description thereof is not repeated.

Generally, memory cells are arranged two-dimensionally, providing a memory array and realizing memory of high capacity. FIG. 2 shows an example including a memory array of 2×2 for convenience of description. Further, power supply potential Vcc is supposed to be 2 V, for practical description. Writing operation when the low power supply potential Vcc of 2 V is used will be described. However, actually, the power supply potential Vcc is not limited to 2 V. Further, the collector power supply potential Vccc is assumed to be the ground potential GND.

By selection in row and column directions, one memory cell in the memory cell array is designated. Referring to FIG. 2, word line WL1 to which memory cells MC1 and MC2 are connected is at a selected state. In other words, word line WL1 is at 2 V. Word line WL2 to which memory cells MC3 and MC4 are connected is at a non-selected state. Namely, word line WL2 is at 0 V. In this manner, selection of a row in the memory array is performed by word lines WL1 and WL2. Bit line pair BL1, /BL1 to which memory cells MC1 and MC3 are connected is at a non-selected state. In this manner, for the bit line of the non-selected column, the pair of bit lines BL1 and /BL1 are set to a low potential level. In the example of FIG. 2, the paired bit lines BL1 and /BL1 are at 0 V. The pair of bit lines BL2 and /BL2 to which memory cells MC2 and MC4 are connected are at the selected state. Since a writing operation is assumed, the paired bit lines BL2 and /BL2 of the selected column are driven to the "H" level and "L" level, in accordance with the write data. In FIG. 2, bit line BL2 is at 2 V, while the bit line /BL2 is at 0 V.

Memory cell MC1 will be described. The word line WL1 connected to memory cell MC1 is at a selected state, and the paired bit lines BL1 and /BL1 to which memory cell MC1 is connected are at non-selected state. At this time, access transistors Q3 and Q4 are on. Consequently, bipolar transistor BP1 has its base connected to storage node N1 of memory cell MC1 through access transistor Q3, while bipolar transistor BP2 has its base B connected to storage node N2 through access transistor Q4. However, the emitters E and collectors C of bipolar transistors BP1 and BP2 are at the ground potential GND, that is, 0 V. In addition, the potential at the base B of bipolar transistors BP1 and BP2 is higher than the potentials of collector C and emitter E. Consequently, bipolar transistors BP1 and BP2 are non-conductive. Accordingly, the "L" level potential stored at storage node N1 and the "H" level potential stored at storage node N2 are not affected by the fact that the word line WL1 is set to the selected state.

Memory cell MC3 will be described. The word line WL2 to which memory cell MC3 is connected is at a non-selected state, and the paired bit lines BL1 and /BL1 to which memory cell MC3 is connected are at the non-selected state. At this time, access transistors Q3 and Q4 are off. Therefore, the data in the memory cell MC3 which is at the non-selected row and the non-selected column is retained. Namely, the "L" level potential at storage node N1 and the "H" level potential at storage node N2 are maintained. Further, as described with respect to memory cell MC1, bipolar transistors BP1 and BP2 are not conductive. Therefore, excessive current does not flow.

Memory cell MC2 will be described. Description will be given assuming that the "L" level potential stored at storage node N1 is to be changed to the "H" level and the "H" level potential stored at the storage node N2 is to be changed to the "L" level potential in memory cell MC2. The word line WL1 and the paired bit lines BL2 and /BL2 to which memory cell MC2 is connected are all at the selected state. Access transistors Q3 and Q4 are on. Further, bit line BL2 is at a high potential (2 V). Therefore, the potential at base B is at a value lower than the potential at bit line BL2 by the voltage Vbe between emitter E and base B, because of the PN diode between emitter E and base B of bipolar transistor BP1. Consequently, current flows from emitter E to collector C and base B of bipolar transistor BP1. The ratio of base current and collector current of bipolar transistor BP1 is given from the current amplification rate of bipolar transistor BP1, and generally the collector current is dominant.

A base current of bipolar transistor BP1 flows to storage node N1 and raises the potential at storage node N1. For example, the potential at bit line BL2 is 2 V, and assuming that the voltage Vbe between emitter E and base B is 0.7 V, the voltage at storage node N1 will be 1.3 V. When the potential at storage node N1 exceeds the threshold voltage of driver transistor Q2, driver transistor Q2 turns on. Consequently, the potential at storage node N2 to which driver transistor Q2 is connected lowers. Since the storage node N2 having the lowered potential is connected to the gate of driver transistor Q1, driver transistor Q1 turns off. When driver transistor Q1 turns off, the base current of bipolar transistor BP1 is cut, and the collector current is also cut. Accordingly, at the time of writing, a large amount of current flows temporarily from the emitter E to the collector C of bipolar transistor BP1, and after writing, this current is immediately cut. Meanwhile, the bit line /BL2 is at a low potential (0 V), and bipolar transistor BP2 does not turn on.

Here, in order to decrease the temporary large current at the time of writing as described with respect to the writing operation to memory cell MC2, a resistance may be connected in series to the collectors C of bipolar transistors BP1 and BP2.

Memory cell MC4 will be described. The word line WL2 to which memory cell MC4 is connected is at a non-selected state and the paired bit lines BL2 and /BL2 to which memory cell MC4 is connected are at the selected state. At this time, access transistors Q3 and Q4 are off. Therefore, the data stored in memory cell MC4 is not influenced at all and maintained as it is. More specifically, the "L" level potential is kept at storage node N1, and the "H" level potential is kept at storage node N2. Meanwhile, the base current of the bipolar transistor BP1 which is connected to the bit line BL2 at a high potential (2 V) is cut, as access transistor Q3 is off. Therefore, the current between the emitter E and collector C of bipolar transistor BP1 is cut.

Figure 3:
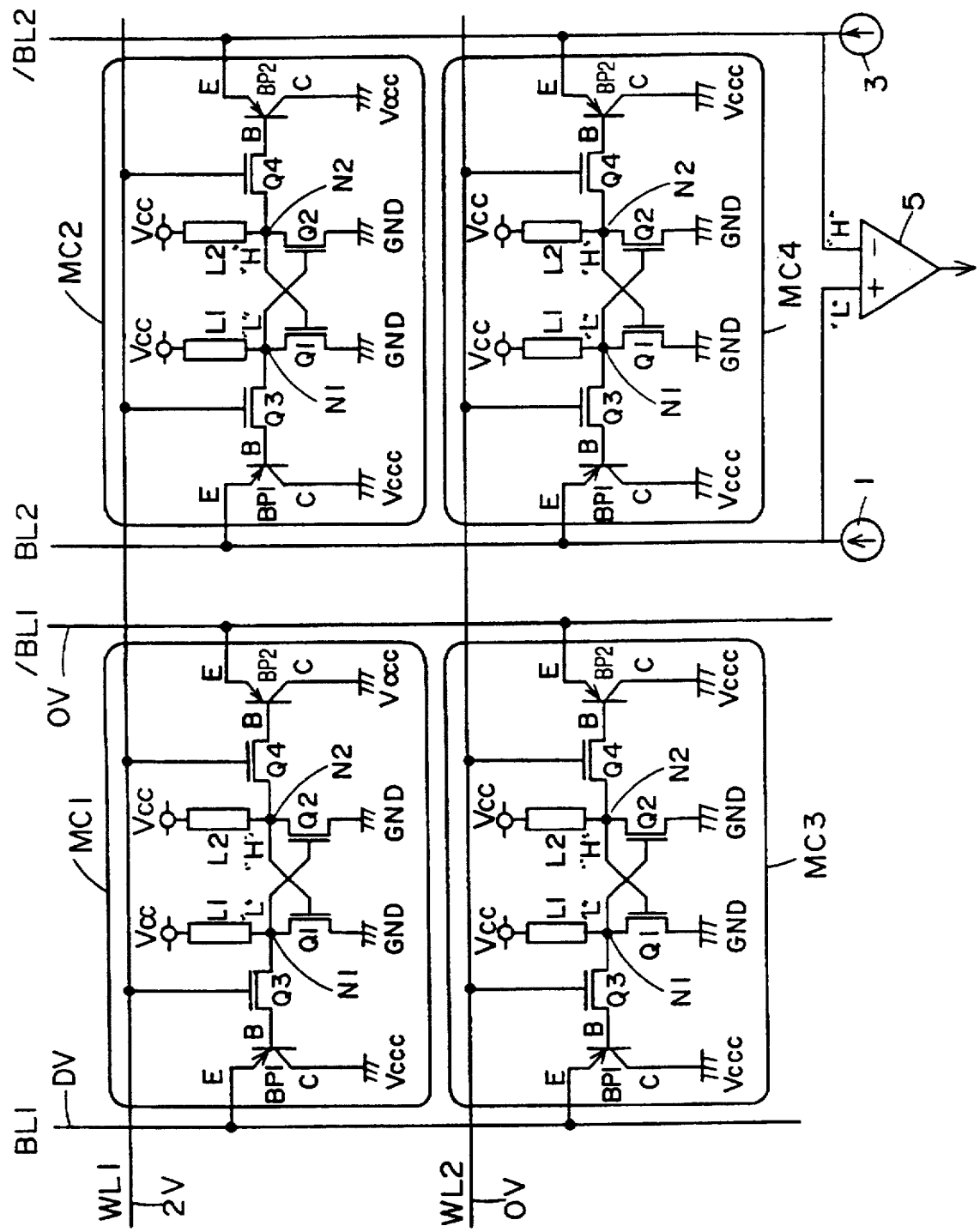
FIG. 3 shows reading operation of the SRAM in accordance with the first embodiment of the present invention.

FIG. 3 is an illustration showing reading operation of the SRAM in accordance with the first embodiment of the present invention. Portions similar to those of FIG. 2 are denoted by the same reference characters, and description thereof is not repeated. The operations of memory cells MC1 and MC3 which are in the non-selected column are the same as the writing operation described with reference to FIG. 2. Therefore, description is not repeated. Only the memory cells MC2 and MC4 which are in the selected column will be described. It is assumed that information is read from memory cell MC2. Before the start of reading operation, bit lines BL1, /BL1, BL2, /BL2 are precharged to the low level (0 V). When reading operation starts, bit lines BL2 and /BL2 of the selected column are pulled up to the high level by current sources 1 and 3. After the bit lines BL2 and /BL2 of the selected column are pulled up to the high level by the current sources 1 and 3, word line WL1 of the selected row is activated. Namely, a voltage of 2 V is applied to word line WL1.

Memory cell MC2 will be described. Word line WL1 and the paired bit lines BL2 and /BL2 connected to memory cell MC2 are all at the selected state. At this time, access transistors Q3 and Q4 are on. It is assumed that the "L" level potential is stored at storage node N1 and "H" level potential is stored at storage node N2 of memory cell MC2.

When the data stored in such a memory cell MC2 is to be read, a current of an appropriate magnitude is supplied from constant current sources 1 and 3 to paired bit lines BL2 and /BL2. Of these currents, the current determined by the current amplification rate of bipolar transistors BP1 in BP2 flows to the memory cell through base B. Therefore, the current sources 1 and 3 must be set to such current values that do not destroy the data in memory cell MC2. In FIG. 3, current sources 1 and 3 of 200 μA are used. Of the current, 10%, that is, 20 μA is assumed to flow to memory cell MC2. Driver transistor Q1 is on, and driver transistor Q2 is off. Accordingly, base current flows to bipolar transistor BP1 connected to the driver transistor Q1, which is on. Accordingly, bipolar transistor BP1 turns on, and the current from current source 1 flows to memory cell MC2. Consequently, the potential at bit line BL2 lowers. Meanwhile, bipolar transistor BP2 does not turn on, and hence the potential at bit line /BL2 increases. Accordingly, there is generated a potential difference between the paired bit lines BL2 and /BL2. The data of memory cell MC2 can be read by sensing and amplifying the potential difference by differential amplifier 5.

As described above, the potential difference between the paired bit lines BL2 and /BL2 is caused by the current (emitter current) flowing through bipolar transistor BP1. This current is considerably larger than the current (base current) flowing to storage node N1 of memory cell MC2 through base B. In other words, the collector current of bipolar transistor BP1 is considerably larger than the base current flowing to the storage node N1. That is, the current flowing to the ground is amplified by bipolar transistor BP1. Therefore, the change in potential at bit line BL2 is larger as compared with the reading operation in the conventional SRAM using the memory cells shown in FIG. 25 or 17. This means that high speed reading operation is possible in the SRAM in accordance with the first embodiment.

Memory cell MC4 will be described. The word line WL2 to which memory cell MC4 is connected is at a non-selected state, and paired bit lines BL2 and /BL2 to which memory cell MC4 is connected is at a selected state. At this time, access transistors Q3 and Q4 are off. Therefore, current does not flow to bipolar transistors BP1 and BP2. Therefore, the data stored in memory cell MC4 is maintained, and it does not affect the data reading operation from memory cell MC2.

As described above, in the SRAM in accordance with the first embodiment, bipolar transistors BP1 and BP2 are provided between the access transistors Q3 and Q4 of the memory cell and the paired bit lines BL, /BL. Therefore, other than the writing operation, a large amount of current does not flow to the storage nodes N1 and N2 of the memory cell through access transistors Q3 and Q4. Further, in the writing operation also, the large amount of current does not flow through access transistors Q3 and Q4 to the storage nodes N1 and N2 of the memory cells other than the memory cell to which writing is to be performed. These are equivalent to setting the gain of the inverter of the memory cell higher. That is, the eyes of the memory cell (static noise margin) are enlarged. In the conventional SRAM employing the memory cells of FIG. 25 or 17, the gain of the inverter in the memory cell was set higher by setting the value (Wd/Ld) to be at least about three times the value (Wa/La). The SRAM of the first embodiment is free from such restriction. Further, even when driver transistors Q1 and Q2 having small drivability (small Wd) are used, the current flowing to the ground can be amplified by the bipolar transistor. Accordingly, when we represent the channel width of driver transistors Q1 and Q2 by Wd, the channel length by Ld, the channel width of access transistors Q3 and Q4 by Wa and the channel length by La in FIG. 1, the channel width Wd of driver transistors Q1 and Q2 can be reduced. Namely, (Wd/Ld)/(Wa/La) can be made smaller to approximately 1, or smaller than 1. Therefore, the memory cell area can be reduced in the SRAM in accordance with the first embodiment.

Figure 4:
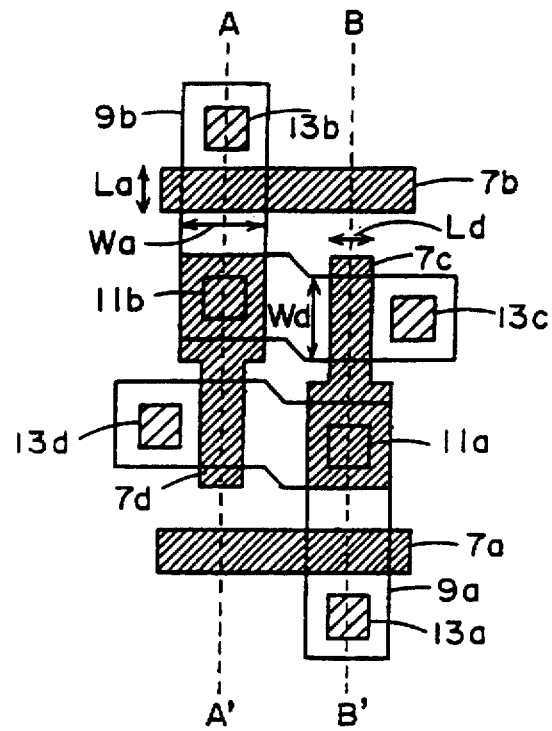
FIG. 4 is a plan view showing the memory cell of FIG. 1 up to the gates of driver transistors Q1 and Q2 and access transistors Q3 and Q4.

FIG. 4 is a plan view showing up to the gates of driver transistors Q1 and Q2 and of access transistors Q3 and Q4 (first polysilicon) of the memory cells in FIG. 1.

Referring to FIG. 4, in the memory cell of FIG. 1, active regions 9a and 9b are formed on a main surface, not shown, of a silicon substrate. First polysilicons 7a, 7b, 7c and 7d are formed on active layers 9a and 9b with an insulating layer, not shown, interposed. The first polysilicon 7c and active layer 9a are connected by a first buried contact 11a. The first buried contact 11a is provided by opening a hole in the insulating layer (gate oxide film) formed between the active layer 9a and first polysilicon 7c. Similarly, the first polysilicon 7d and active layer 9b are connected by a first buried contact 11b.

Using the first polysilicon 7a as the gate and active layer 9a as the source and drain, access transistor Q4 is formed. Using first polysilicon 7c as the gate and active layer 9b as the source and drain, driver transistor Q1 is formed. Using the first polysilicon 7d as the gate and active layer 9a as the source and drain, driver transistor Q2 is formed. Using the first polysilicon 7b as the gate and active layer 9b as the source and drain, access transistor Q3 is formed.

Figure 5:
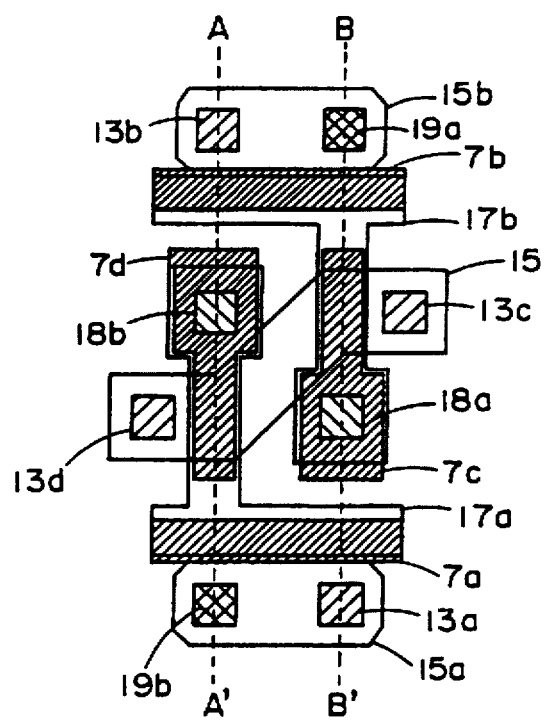
FIG. 5 is a plan view showing up to the load elements L1 and L2 of the memory cell shown in FIG. 1.

FIG. 5 is a plan view showing up to the load elements (high resistance elements) L1 and L2 of the memory cell of FIG. 1. Portions similar to those of FIG. 4 are denoted by the same reference characters and description thereof is not repeated.

Second polysilicons 15, 15a and 15b are formed on first polysilicons 7a to 7d, with an insulating layer, not shown, interposed. The second polysilicon 15 and active layer 9b (FIG. 4) are connected by a second buried contact 13c. The second polysilicon 15 and active layer 9a (FIG. 4) are connected by a second buried constant 13d. The second polysilicon 15a and active layer 9a (FIG. 4) are connected by a second buried contact 13a. The second polysilicon 15b and active layer 9b (FIG. 4) are connected by a second buried contact 13b. Third polysilicons 17b and 17a are formed on the second polysilicons 15, 15b and 15c. The second polysilicon 17b and the first polysilicon metal interconnection 23b is used as bit line /BL (FIG. 1).

Figure 6:
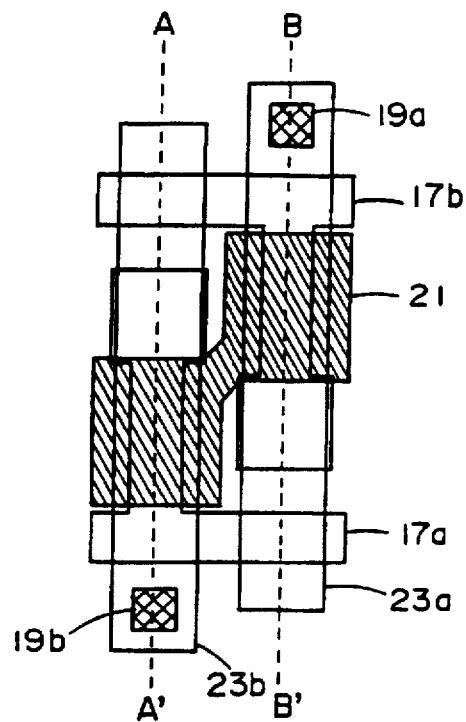
FIG. 6 is a plan view showing up to the bit line pair BL and /BL connected to the memory cell of FIG. 1.
Figure 7:
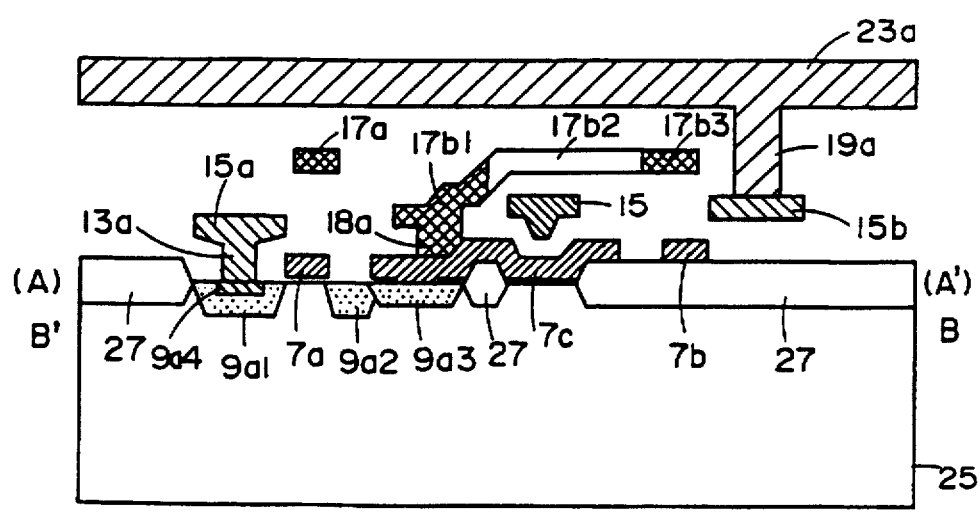
FIG. 7 is a cross section taken along the lines AA' and BB' of FIG. 6.

FIG. 7 is a cross section taken along the lines AA' and BB' of FIG. 6. The cross section taken along the line AA' is equivalent to the c ross section taken along the line BB" rotated by 180° with the center of the memory cell being the axis of rotation. Namely, the cross section taken along the line AA' is in symmetry to the cross taken along the line BB' by 180° rotated about the center of the memory cell serving as an axis. Therefore, in the following, the cross section taken along the line BB' will be referred to. Portions similar to those of FIG. 46 are denoted by the same reference characters and description thereof is not repeated.

Referring to FIG. 7, a field oxide film 27 is formed at the main surface of silicon substrate 27. The main surface of the silicon substrate on which field oxide film 27 is not formed will be the active layer (active region). In the active layer (active region) of silicon substrate 25, one and the other of the source/drain region 9a1 and 9a2 of access transistor Q4 are formed. On the active layer between one and the other of the source/drain regions 9a1 and 9a2 of access transistor Q4, the first polysilicon 7a (gate of access transistor Q4) is formed, with an insulating layer (gate oxide film) not shown, interposed. The active layer immediately below the first polysilicon 7a (gate) is the channel region of access transistor Q4.

In one of the source/drain regions 9a1 of access transistor Q4, emitter 9a4 of bipolar transistor BP2 is formed. The one of the source/drain regions 9a1 of access transistor Q4 also serves as the base of bipolar transistor BP2. More specifically, region 9a1 is one of the source/drain of access transistor Q4 and it is also the base of bipolar transistor BP2. Silicon substrate 25 is used as collector C of bipolar transistor BP2. More specifically, backgate terminals of driver transistors Q1 and Q2 as well as of access transistors Q3 and Q4 serve as the collector C of bipolar transistor BP2.

An impurity regions 9a3 is formed in the active layer of silicon substrate 25. On impurity region 9a3, the first polysilicon 7c is formed with an insulating layer, not shown, interposed. The first polysilicon 7c and impurity region 9a3 are connected through a hole provided in the insulating layer (gate oxide film), not shown. More specifically, impurity region 9a3 and the first polysilicon 7c are connected by the first buried contact 11a (FIG. 4). Regions 9a1 to 9a4 and channel region of access transistor Q4 are parts of the active layer 9a shown in FIG. 4. The first polysilicon 7c is used as the 7c are connected by a first contact hole 18a. The third polysilicon 17a and the first polysilicon 7d are connected by a first contact hole 18b.

FIG. 6 is a plan view showing up to the bit lines BL and/BL connected to the memory cell of FIG. 1. Portions similar to those of FIG. 5 are denoted by the same reference characters and description thereof is not repeated.

Using a pattern 21 as a mask, ion implantation to third polysilicons 17a and 17b is performed. Accordingly, portions of the third polysilicons 17a and 17b not covered by pattern 21 come to have lower resistance values, and these portions are used as interconnections, especially as interconnections for supplying the power supply potential. Of third polysilicons 17a and 17b, portions which are covered by pattern 21 will be the polysilicons of high resistance, which are used as load elements L1 and L2 of the memory cell. On the third polysilicons 17a and 17, metal interconnections 23a and 23b are formed with an insulating layer, not shown, interposed. Metal interconnection 23a and second polysilicon 15b (FIG. 5) are connected by a second contact hole 19a. Metal interconnection 23b and second polysilicon 15a are connected by a second contact hole 19b. Metal interconnection 23a is us ed as a bit line BL (FIG. 1) and gate of driver transistor Q1. The active layer of silicon substrate 25 below the first polysilicon 7c (where impurity region 9a3 is not formed) serves as the channel region of driver transistor Q1. The first polysilicon 7b is formed on field oxide film 27. Therefore, the first polysilicon 7b serves as an interconnection.

On the first polysilicons 7a to 7c, second polysilicons 15, 15a, and 15b are formed with an insulating layer, not shown, interposed. The second polysilicon 15a and emitter region 9a4 of bipolar transistor BP2 are connected by the second buried contact 13a. On the second polysilicons 15, 15a and 15b, the third polysilicons 17a, 17b1, 17b2 and 17b3 are formed with an insulating layer, not shown, interposed. The third polysilicon 17b1 and the first polysilicon 7c are connected by the first contact hole 18a. The third polysilicon 17b2 corresponds to that portion of the third polysilicon 17b shown in FIG. 6 which is overlapped with pattern 21, that is, the portion having high resistance. Namely, the third polysilicon 17b2 is the load element L2. The third polysilicons 17b and 17b3 are portions of the third polysilicon 17b of FIG. 25 that are not covered by pattern 21, which have low resistance. On the third polysilicons 17a and 17b1 to 17b3, metal interconnection 23a is formed with an insulating layer, not shown, interposed. Metal interconnection 23a and second polysilicon 15b are connected by the second contact hole 19a. Metal interconnection 23a is used as the bit line BL (FIG. 1).

As described above, in the SRAM in accordance with the first embodiment, the gain of the inverter in the memory cell is raised (eyes of the memory cell are enlarged) by providing bipolar transistors BP1 and BP2, whereby the value (Wd/Ld)/(Wa/La) can be made smaller to approximately 1 or smaller than 1. As can be seen from FIG. 4, the value (Wd/Ld)/(Wa/La) is approximately 1.

Further, the emitter E of bipolar transistor BP2 (BP1) is formed in one of the source/drain regions 9a1 of access transistor Q4 (Q3), one of the source/drain regions 9a1 of access transistor Q4 (Q3) is used as the base B, and the backgate terminals (silicon substrate 25) of driver transistors Q1 and Q2 and access transistors Q3 and Q4 are used as collector C. Therefore, the area is hardly increased by the provision of bipolar transistors BP1 and BP2. Further, load elements L1 and L2 are provided on driver transistors Q1 and Q2 and access transistors Q3 and Q4.

As described above, in the SRAM in accordance with the first embodiment, the gain of the inverter in the memory cell is made higher by the provision of bipolar transistors BP1 and BP2 (eyes of the memory cell are enlarged), and hence the area of the memory cell can be reduced.

Further, in the SRAM in accordance with the first embodiment even when the power supply potential is low (2 V), the gain of the inverter of the memory cell can be set higher (eyes of the memory cell can be made larger) by the provision of bipolar transistors BP1 and BP2.

As described above, unlike the prior art, the eyes of the memory cell when the power supply potential is low are not enlarged by forming the PMOS transistors as load elements on the main surface of the silicon substrate in the SRAM of the first embodiment. Therefore, in the SRAM in accordance with the first embodiment, latch up or increase in area of the memory cell is not caused when the low power supply potential is used.

Further, in SRAM in accordance with the first embodiment, the current pulled out to the ground by the driver transistor connected to the storage node which stores the data at the "L" level is amplified by the bipolar transistor. Accordingly, the time necessary for amplifying the bit lines can be made shorter, which enables high speed reading. Further, in the SRAM of the first embodiment, current flows only through the memory cell at a crosspoint between the selected row and the selected column at the time of operation, and therefore operational current is small.

(Second Embodiment)

The memory cell of the SRAM in accordance with the second embodiment is similar to the memory cell of the SRAM in accordance with the first embodiment. More specifically, the circuit diagram, the plan view and the cross section of the memory cell of the SRAM in accordance with the second embodiment are similar to those of the memory cell of the SRAM in accordance with the first embodiment. In the following, difference over the SRAM in accordance with the first embodiment will be described.

In the memory cell of the SRAM in accordance with the second embodiment, referring to FIG. 1, the absolute value of the threshold voltage of access transistors Q3 and Q4 is set smaller than the absolute value of the threshold voltage of driver transistors Q1 and Q2. This allows enlargement of the eyes of the memory cell. The details are as follows.

Figure 8:
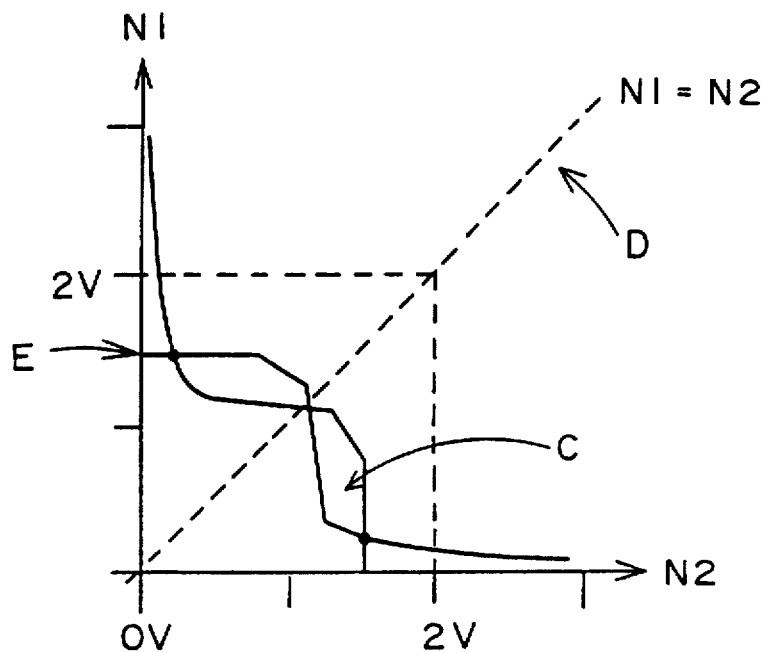
FIG. 8 shows transfer characteristic of the memory cell in the reading operation, of the SRAM in accordance with a second embodiment of the present invention.

FIG. 8 shows transfer characteristic of the memory cell in the reading operation of the SRAM in accordance with the second embodiment. The ordinate represents the potential at storage node N1 (FIG. 1), and the abscissa represents the potential at storage node N2 (FIG. 1). The dotted line denoted by the arrow D shows the relation between potentials at storage nodes N1 and N2 when the potentials at storage nodes N1 and N2 are equal to each other. The power supply potential Vcc of 2 V is used in the SRAM in accordance with the second embodiment. Namely, a low power supply potential is used.

Referring to FIG. 8, the high level of the transfer characteristic such as denoted by the arrow E is determined in the following manner where the voltage of word line WL is represented by V (WL), the threshold voltage of access transistors Q3 and Q4 is denoted by Vtha, the voltage of the paired bit lines BL and /BL is represented by V (BL), and the voltage between the base B and emitter E of bipolar transistors BP1 and BP2 is represented by Vbe. More specifically, of [V (WL)-Vtha] and [V (BL)-Vbe], the smaller is the high level (arrow E) of transfer characteristic. Now, the voltage Vbe between the base B and the emitter E of bipolar transistors BP1 and BP2 is determined by the impurity concentration for forming the baseᵠ8emitter, which is the PN junction, and it is generally a value of about 0.4 V to about 0.8 V. Further, the voltage of the word line which is at the selected state and the voltage of the bit line which is at the selected state are both set to the power supply voltage Vcc (2 V). In such a case, the threshold voltage Vtha of access transistors Q3 and Q4 is set to a voltage smaller than the voltage Vbe between the base and the emitter of bipolar transistors BP1 and BP2. More specifically, the threshold voltage Vtha of access transistors Q3 and Q4 is set to be smaller than the threshold voltage Vthd of driver transistors Q1 and Q2. By doing so, it becomes possible to determine the high level (arrow E) of the transfer characteristic by V (BL)-Vbe, and as a result, the high level of the transfer characteristic can be made higher. Here, it is taken into account that Vbe and Vthd are approximately the same value and that even when memory cell is designed to have Vthd=Vtha, the value appears to be Vthd<Vtha because of the backgate effect. Meanwhile, since bipolar transistors BP1 and BP2 are provided, the gain of the inverter in the memory cell can be made higher, as shown by the arrow C.

As described above, in the SRAM in accordance with the second embodiment, both the gain (arrow C) and the high level of the transfer characteristic (arrow E) can be set higher. Therefore, in the SRAM in accordance with the second embodiment, the eyes of the memory cell can be enlarged more than in the SRAM in accordance with the first embodiment, and hence stability in data retention can be increased. Further, in can operate at a lower power supply potential than the SRAM in accordance with the first embodiment. Further, since the circuit diagram, plan view and the cross section of the SRAM in accordance with the second embodiment are the same as those of the first embodiment, the SRAM in accordance with the second embodiment has similar effects as the SRAM in accordance with the first embodiment.

Further, the potential of the bit line which is the non-selected state is a low potential. Therefore, current from the storage nodes N1 and N2 of the memory cell to the paired bit lines BL and /BL is cut by the bipolar transistors BP1 and BP2. Therefore, the problem of increased standby current is not experienced when the threshold voltage Vtha of access transistors Q3 and Q4 is made smaller.

(Third Embodiment)

The memory cell of the SRAM in accordance with the third embodiment is similar to the memory cell of the SRAM in accordance with the first embodiment, except the cross section. In other words, the circuit diagram and the plan view of the memory cell in accordance with the third embodiment are the same as those of the memory cell of the SRAM in accordance with the first embodiment. What is different is the cross section.

Figure 9:
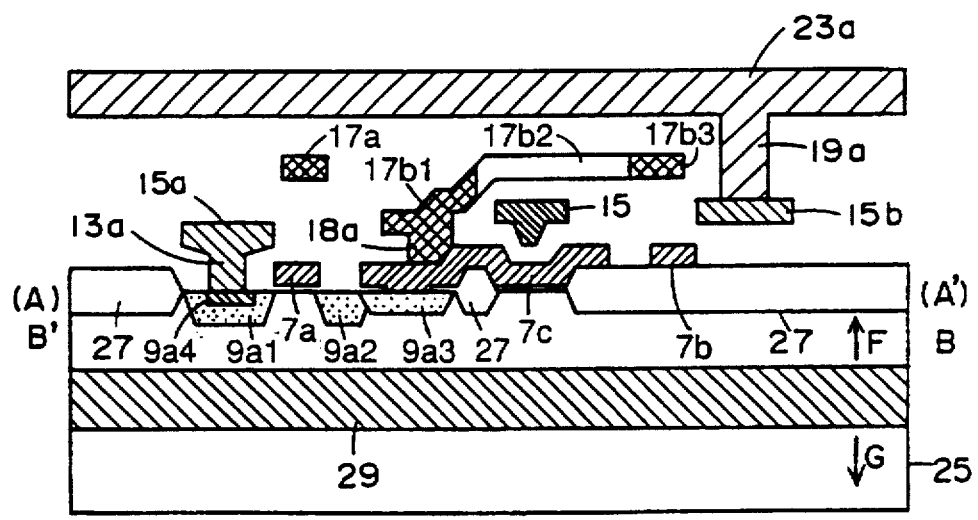
FIG. 9 is a cross section of a memory cell of an SRAM in accordance with a third embodiment of the present invention.

FIG. 9 is a cross section of the memory cell of the SRAM in accordance with the third embodiment. The cross section of FIG. 9 is taken along the lines AA' and BB' of FIG. 6. Portions similar to those of FIG. 7 are denoted by the same reference characters and description thereof is not repeated.

Referring to FIG. 9, a high concentration impurity layer 29 is provided in silicon substrate 25. More specifically, it has higher concentration than silicon substrate 25, and hence high concentration impurity layer 29 serves as a low resistance layer.

In this manner, in the SRAM in accordance with the third embodiment, since the high concentration impurity layer is provided in silicon substrate 25, the collector power supply potential Vccc can be supplied uniformly to the entire memory array. Therefore, the influence of distance in supplying the collector power supply potential Vccc can be suppressed.

Further, adjustment of the depth of high concentration impurity layer 29 corresponds to adjustment of the resistance value of the resistance connected in series to the collectors C of bipolar transistors BP1 and BP2 (FIG. 1). More specifically, when the high concentration impurity layer 29 is formed in the direction denoted by the arrow F, the resistance value of the resistance connected in series to collector C is made smaller. Meanwhile, if the high concentration impurity layer 29 is formed in the direction denoted by the arrow G, the resistance value of the resistance connected in series to collector C is increased.

In this manner, in the SRAM in accordance with the third embodiment, by adjusting the depth of high concentration impurity layer 29, the resistance value of the resistance connected in series to the collectors C of bipolar transistors BP1 and BP2 is adjusted, whereby the large current temporarily flowing from emitter E to collector C at the time of writing can be suppressed.

Further, the memory cell of the SRAM in accordance with the third embodiment is similar to the memory cell of the SRAM in accordance with the first embodiment. Therefore, the SRAM in accordance with the third embodiment has similar effects as the SRAM in accordance with the first embodiment.

Further, in the SRAM in accordance with the third embodiment also, similar to the SRAM in accordance with the second embodiment, the absolute value of the threshold voltage of the access transistor can be set smaller than the absolute value of the threshold voltage of the driver transistors.

(Fourth Embodiment)

The memory cell of the SRAM in accordance with the fourth embodiment is similar to the memory cell of the SRAM in accordance with the first embodiment except the manner of connection with the bit line. More specifically, the circuit diagram of the SRAM in accordance with the fourth embodiment is the same as the circuit diagram of the SRAM in accordance with the first embodiment.

Figure 10:
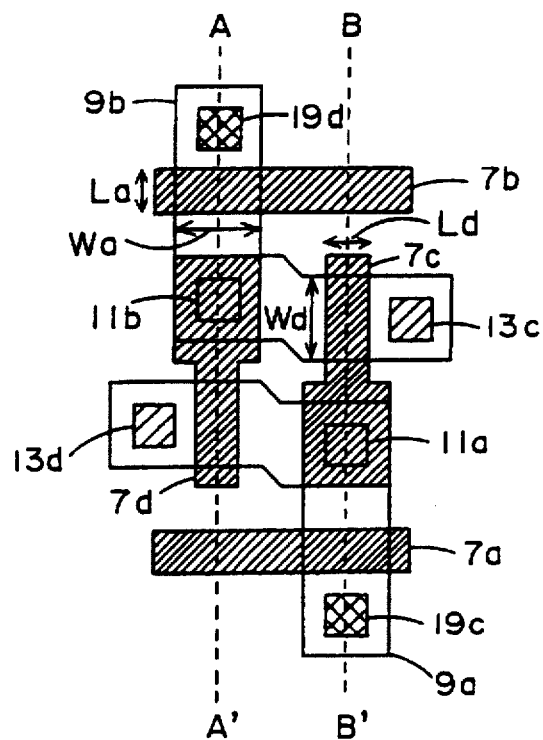
FIG. 10 is a plan view showing up to the gates of driver transistors Q1 and Q2 and of access transistors Q3 and Q4 of the memory cell of the SRAM in accordance with a fourth embodiment of the present invention.
Figure 11:
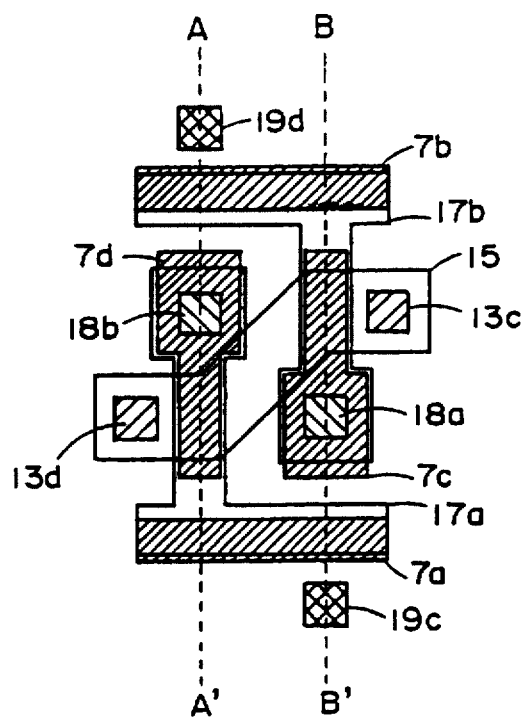
FIG. 11 is a plan view showing up to the load elements L1 and L2 of the memory cell of the SRAM in accordance with the fourth embodiment of the present invention.
Figure 12:
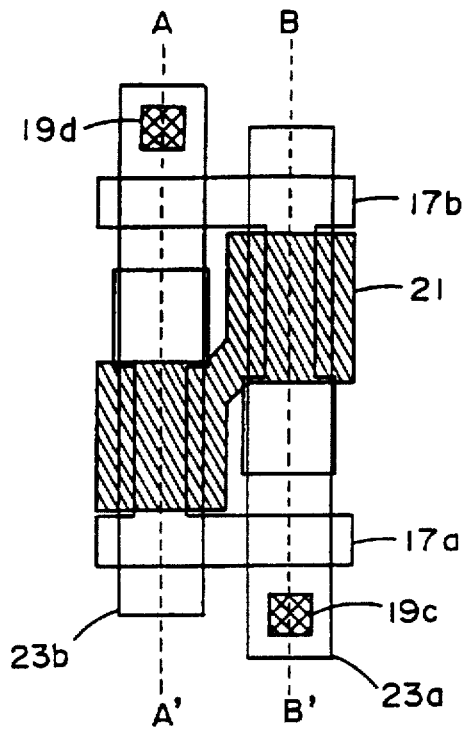
FIG. 12 is a plan view showing up to the bit line pair BL and /BL connected to the memory cell of the SRAM in accordance with the fourth embodiment.

FIG. 10 is a plan view showing up to the gates (FIG. 1) of the driver transistors Q1 and Q2 and of the access transistors Q3 and Q4 of the memory cell SRAM in accordance with the fourth embodiment. FIG. 11 is a plan view showing up to the load elements L1 and L2 (FIG. 11) of the memory cell of the SRAM in accordance with the fourth embodiment. FIG. 12 is a plan view showing up to the bit line pair BL, /BL (FIG. 1) connected to the memory cell of the SRAM in accordance with the fourth embodiment. Portions similar to those of FIGS. 4, 5 and 6 are denoted by the same reference characters and description thereof is not repeated.

Referring to FIG. 11, in the memory cell of the SRAM in accordance with the fourth embodiment, unlike the one shown in FIG. 5, second polysilicons 15a and 15b are not formed. Referring to FIGS. 10 and 12, metal interconnection 23a and active layer 9a are connected by the second contact hole 19c. Metal interconnection 23b and active layer 9b are connected by the second contact hole 19d. Metal interconnection 23a is used as bit line /BL, while metal interconnection 23b is used as bit line BL.

Figure 13:
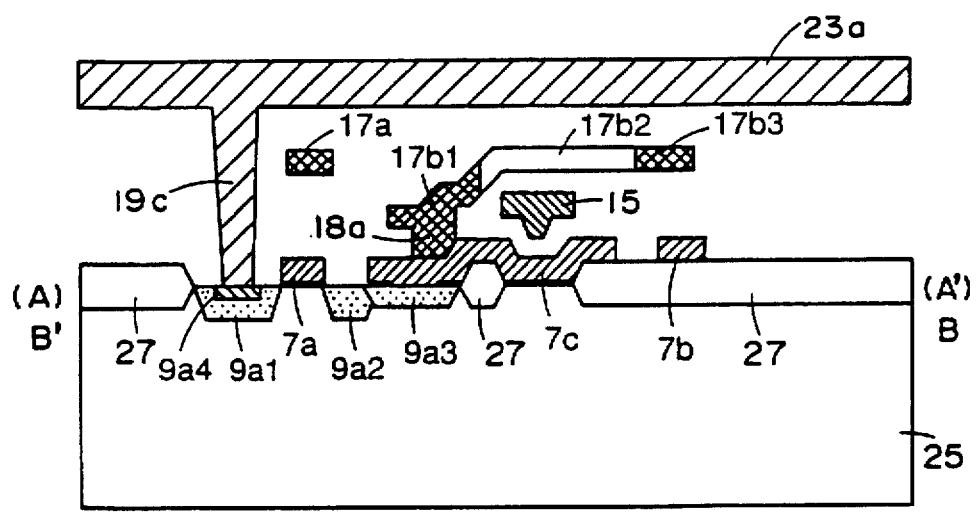
FIG. 13 is a cross section taken along the lines AA' and BB' of FIG. 12.

FIG. 13 is a cross section taken along the lines AA' and BB' of FIG. 12. Portions similar to those of FIGS. 7 and 10 to 12 are denoted by the same reference characters and description thereof is not repeated. The cross section taken along the line AA' is the same as the cross section taken along the line BB' rotated by 180° about the center of the memory cell, which is the axis of rotation. Therefore, the cross section taken along the line BB' will be referred to in the following.

Referring to FIG. 13, metal interconnection 23a and emitter 9a4 of bipolar transistor BP2 are connected by the second contact hole 19c. In FIGS. 4 to 6 and 7, the metal interconnection and the emitter of the bipolar transistor are connected through the second polysilicon.

As described above, the SRAM in accordance with the fourth embodiment differs from the SRAM in accordance with the first embodiment only in the manner of connection between the metal interconnection and the emitter E of bipolar transistor. Therefore, the SRAM in accordance with the fourth embodiment has the same effects as the SRAM in accordance with the first embodiment.

It is also possible in the SRAM in accordance with the fourth embodiment to provide a high concentration impurity layer in the silicon substrate, as in FIG. 9. Further, the threshold value of the access transistor can be set in the similar manner as the SRAM in accordance with the second embodiment, also in the SRAM in accordance with the fourth embodiment.

(Fifth Embodiment)

The memory cell MC of the SRAM in accordance with the fifth embodiment may be the same as the memory cell of the SRAM in accordance with the first to fourth embodiments. Therefore, the SRAM in accordance with the fifth embodiment has the same effects as the SRAM in accordance with the first to fourth embodiments.

Figure 14:
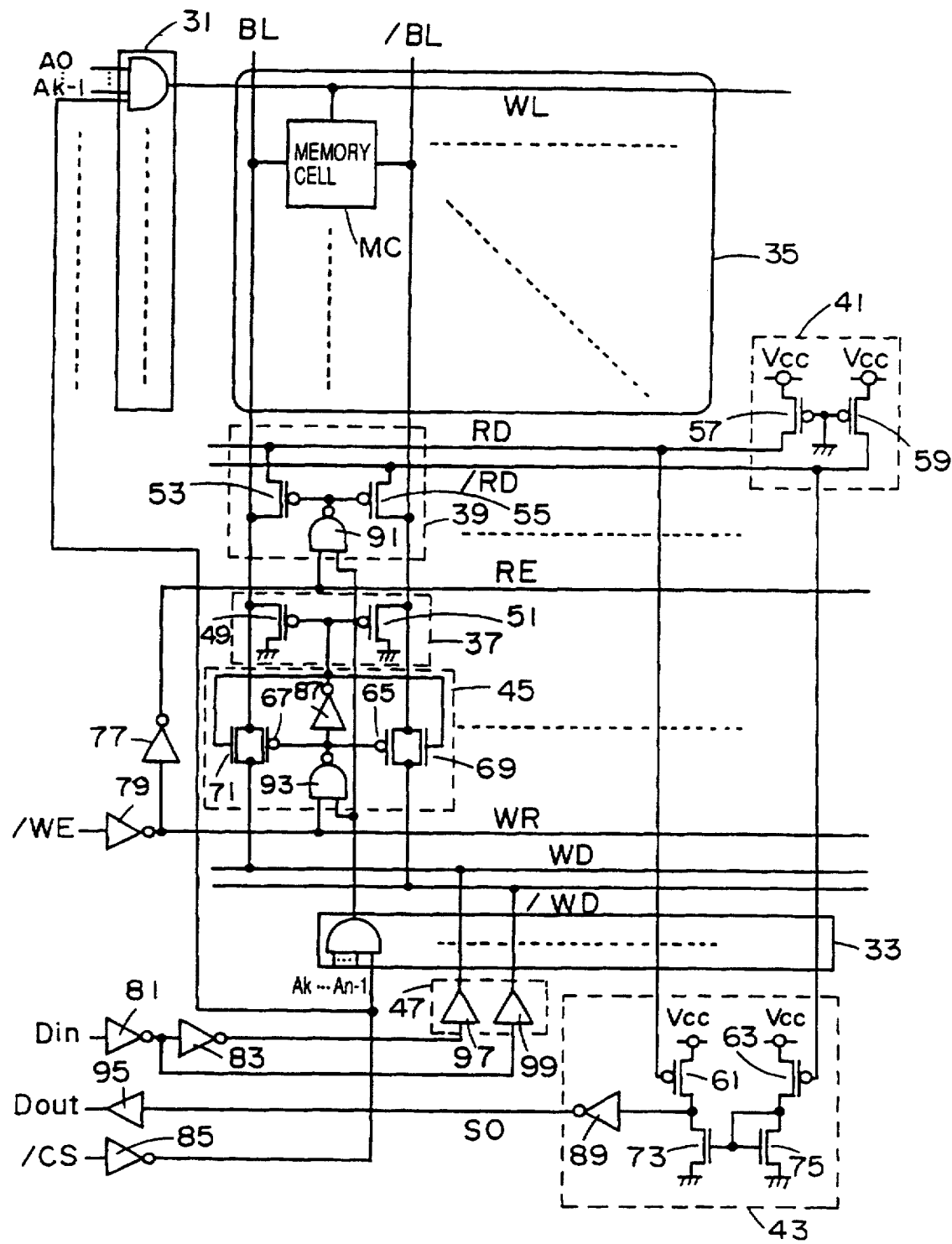
FIG. 14 is a circuit diagram showing details of a peripheral circuitry of the SRAM in accordance with a fifth embodiment of the present invention.

FIG. 14 shows the SRAM in accordance with the fifth embodiment, mainly showing details of the peripheral circuitry. Here, ". . ." represents repetition.

Referring to FIG. 14, the SRAM in accordance with the fifth embodiment includes a memory array 35. Memory array 35 includes a plurality of memory cells MC arranged two-dimensionally. Memory cells MC are connected to word line WL and paired bit lines BL, /BL.

Referring to FIG. 14, the peripheral circuitry of the SRAM in accordance with the fifth embodiment includes a row decoder 31, a column decoder 33, a bit line load 37, transfer gates 39 and 45, a load element 41, a differential amplifier 43, a write driver 47, inverters 77, 79, 81, 83 and 85, and a buffer 95. Bit line load 37 includes PMOS transistors 49 and 51. Transfer gate 39 includes PMOS transistors 53, 55 and an NAND circuit 91. Transfer gate 45 includes PMOS transistors 67 and 65, NMOS transistors 69 and 71, an inverter 87 and an NAND circuit 93. Load element 41 includes PMOS transistors 57 and 59. Differential amplifier 43 includes PMOS transistors 61 and 63, an inverter 89 and NMOS transistors 73 and 75. Write driver 47 includes buffers 97 and 99.

Address signals A0 to Ak-1 corresponding to the row are decoded by row decoder 31. Row decoder 31 selects one of a plurality of word lines WL. Meanwhile, address signals Ak to An-1 corresponding to the column are decoded by column decoder 33. Column decoder 33 selects one of the plurality of columns.

Figure 15:
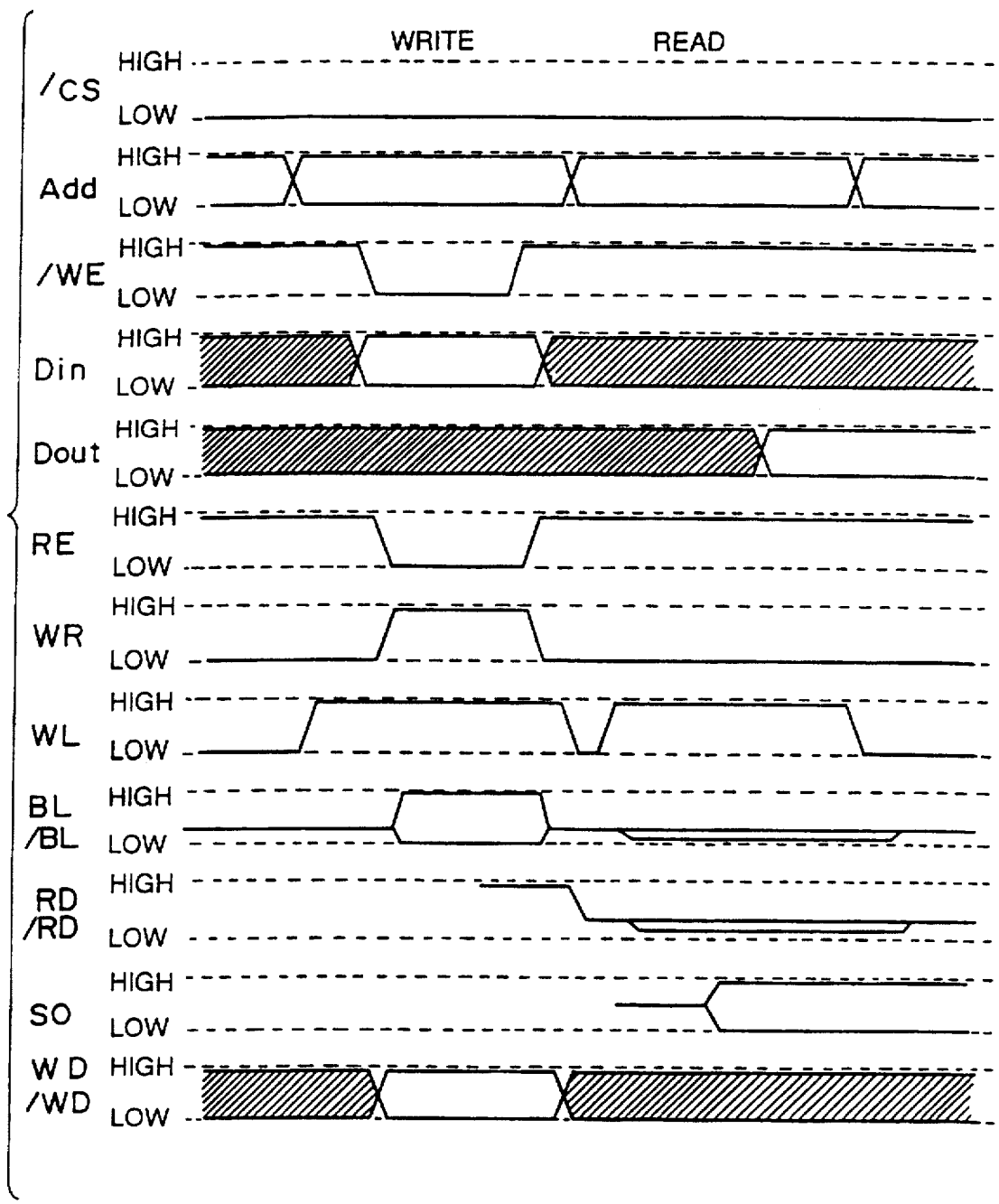
FIG. 15 shows operation of the SRAM in accordance with the fifth embodiment of the present invention.

FIG. 15 is a timing chart showing the operation of the SRAM shown in FIG. 15. A chip select signal /CS, an address signal Add, a write enable signal /WE, input data Din and output data Dout are signals for the interface between SRAM and the outside. Address signal Add represents the address signals A0 to An-1 of FIG. 14. Referring to FIG. 15, reference characters similar to read signal line RE, write signal line WR, word line WL, bit line pair BL, /BL, read data line pair RD /RD, output signal line SO and write data line pair WD, /WD denote voltages (signals) on read signal line RE, write signal line WR, word line WL, bit line pair BL, /BL, read data line pair RD, /RD, output signal line SO and write data line pair WD, /WD. In FIG. 15, the waveforms in dotted lines are at instable state and portions where signal waveforms are not shown are portions omitted, since these are not related to the following description.

Referring to FIGS. 14 and 15, the writing operation of the SRAM in accordance with the fifth embodiment will be described. In the following, description will be given assuming that the SRAM shown in FIG. 14 is selected by the chip select signal /CS at the "L" level, the uppermost word line WL of FIG. 14 is selected by the address signals A0 to Ak-1 and the leftmost column of FIG. 14 is selected by the address signals Ak to An-1.

The selected word line WL is at the "H" level. The write enable signal /WE at the "L" level is input to inverter 79. Therefore, the write signal line WR comes to have the potential at the "HH" level. Accordingly, a signal at "H" level is input to one input node of NAND circuit 93. It is assumed that the leftmost column is selected. Therefore, from the decoder 33, a signal at the "H" level is input to NAND circuit 93. NAND circuit 93 outputs a signal at the "L" level to inverter 87 and PMOS transistors 65 and 67. Consequently, PMOS transistors 65 and 67 a returned on. Since a signal at the "H" level is output from inverter 87, NMOS transistors 69 and 71 are turned on, while PMOS transistors 49 and 51 are turned off.

From the foregoing, when the write enable signal /WE at the "L" level is input, the paired bit lines BL and /BL and the paired write data lines WD and /WD are connected by the transfer gate 45. Here, if the leftmost column is selected and the write enable signal /WE at the "L" level is input, a signal at the "L" level is input to one input node and a signal at the "H" level is input to the other input node, of NAND circuit 91. Consequently, the output from NAND circuit 91 will be a signal having the "H" level. Consequently, PMOS transistors 53 and 55 turn off.

Meanwhile, input data Din is input to the buffer 97 of write driver 47, through inverters 81 and 83. Further, input data Din is input to buffer 99 of write driver 47 through inverter 81. Write driver 47 applies voltage to write data line pair WD./WD in accordance with the input data Din. Here, write enable signal /WE is at "L" level, and the leftmost column is selected. Therefore, the paired bit lines BL and /BL and the paired write data lines WD and /WD are connected. Accordingly, voltage is supplied to the bit line pair BL, /BL in accordance with the input data Din. From the foregoing, input data Din is written to memory cell MC.

Reading operation will be described. In this case also, as in the writing operation, it is assumed that the SRAM of FIG. 14 is selected by the chip select signal /CS at the "L" level, the uppermost word line WL of FIG. 14 is selected and the leftmost column of FIG. 14 is selected.

The selected word line WL is at the "H" level. The write enable signal /WE at the "H" level is input to inverter 79. Therefore, a signal at the "H" level is input to one input node of NAND circuit 91. Further, since the leftmost column is selected, a signal at the "H" level is input to the other input node of NAND circuit 91 from decoder 33. Therefore, the output signal from NAND circuit 91 attains to the "L" level. Accordingly, PMOS transistors 53 and 54 turn on. In response, the paired bit lines BL and /BL and paired read data lines RD and /RD are connected. Then, current flows from load element 41 to bit line pair BL, /BL. The load element 41 is a constant current source, which corresponds to the constant current sources 1 and 3 of FIG. 3, for example. When the current from load element 41 flows to the bit line pair BL, /BL, data is read from memory cell MC to the paired bit lines BL and /BL and the paired read data lines RD and /RD. In other words, there is generated a potential difference between the bit line pair BL, /BL and read data line pair RD, /RD. The potential difference between the read data line pair RD, /RD is amplified by differential amplifier 43. The data read from the memory cell MC is output as output data Dout from differential amplifier 43 through output signal line S0 and buffer 95.

Here, when the write enable signal /WE at the "H" level is input, the signal at the "L" level is input to one input node of NAND circuit 93. Therefore, the output signal from NAND circuit 93 is at "H" level. Therefore, the output signal from inverter 87 is at the "L" level, and PMOS transistors 51 and 49 turn on. In this manner, in reading operation, the bit line load 51 is driven. Since the bit line pair load 51 is provided, the voltages on bit line pair BL and /BL never increases to be higher than the threshold voltage Vthp of PMOS transistors 49 and 51. Here, the threshold voltage Vthp of PMOS transistors 49 and 51 is set higher than the voltage Vbe between the emitter E and the base B when the bipolar transistors BP1 and BP2 (FIG. 1) of the memory cell MC are on. Therefore, the bit line voltage when the bipolar transistors BP1 and BP2 (FIG. 1) are on is smaller than the threshold voltage Vthp. In the reading operation, as described above, the output signal from NAND circuit 93 is at the "H" level and the output signal from inverter 87 is at the "L" level. Therefore, NMOS transistors 69 and 71 and PMOS transistors 65 and 67 are off.

(Sixth Embodiment)

Figure 16:
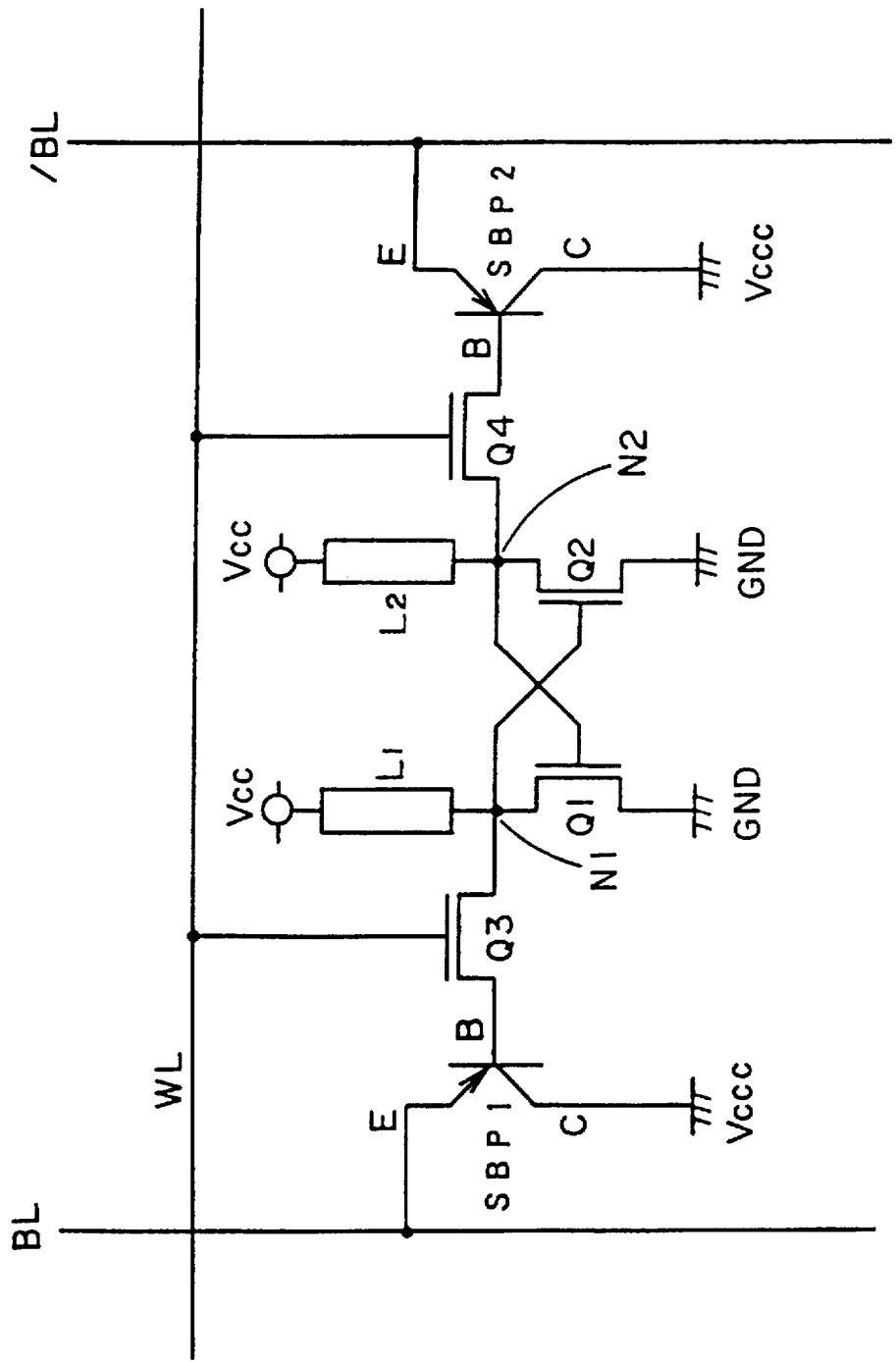
FIG. 16 is a circuit diagram showing details of a memory cell of the SRAM in accordance with a sixth embodiment of the present invention.

FIG. 16 is a circuit diagram showing details of the memory cell in the SRAM in accordance with the sixth embodiment. Portions similar to those of FIG. 1 are denoted by the same reference characters and description thereof is not repeated. Referring to FIG. 16, the memory cell of the SRAM in accordance with the sixth embodiment includes driver transistors Q1 and Q2, access transistors Q3 and Q4, bipolar transistors SBP1 and SBP2, and load elements L1 and L2. Bipolar transistor SBP1 has its emitter E connected to bit line BL, its base B connected to access transistor Q3 and collector C connected to a node to which collector power supply potential Vccc is applied. Bipolar transistor SBP2 has its emitter E connected to bit lines /BL, base B connected to access transistor Q4 and collector C connected to a node to which collector power supply potential Vccc is applied. Here, the collector power supply potential Vccc is the ground potential GND. Bipolar transistors SBP1 and SBP2 are of PNP type. When memory cells of FIGS. 16 and 1 are compared, these are similar except that the structure of bipolars SBP1 and SBP2 of the memory cell shown in FIG. 16 differs from the structure of bipolar transistors BP1 and BP2 of FIG. 1. Therefore, in the following, description will be given focusing on the bipolar transistors SBP1 and SBP2 of the memory cell shown in FIG. 16.

Figure 17:
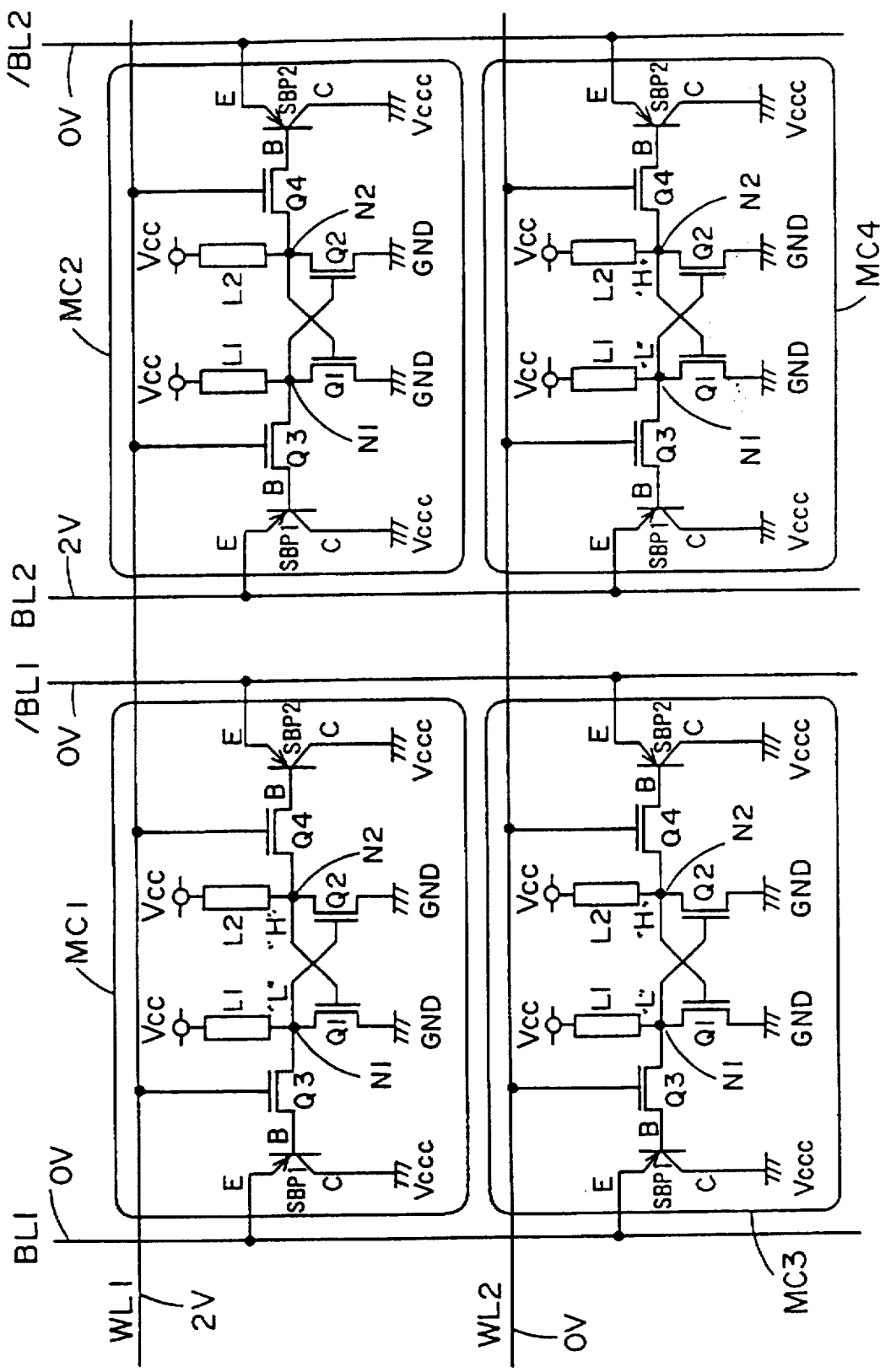
FIG. 17 shows writing operation of the SRAM in accordance with the sixth embodiment of the present invention.
Figure 18:
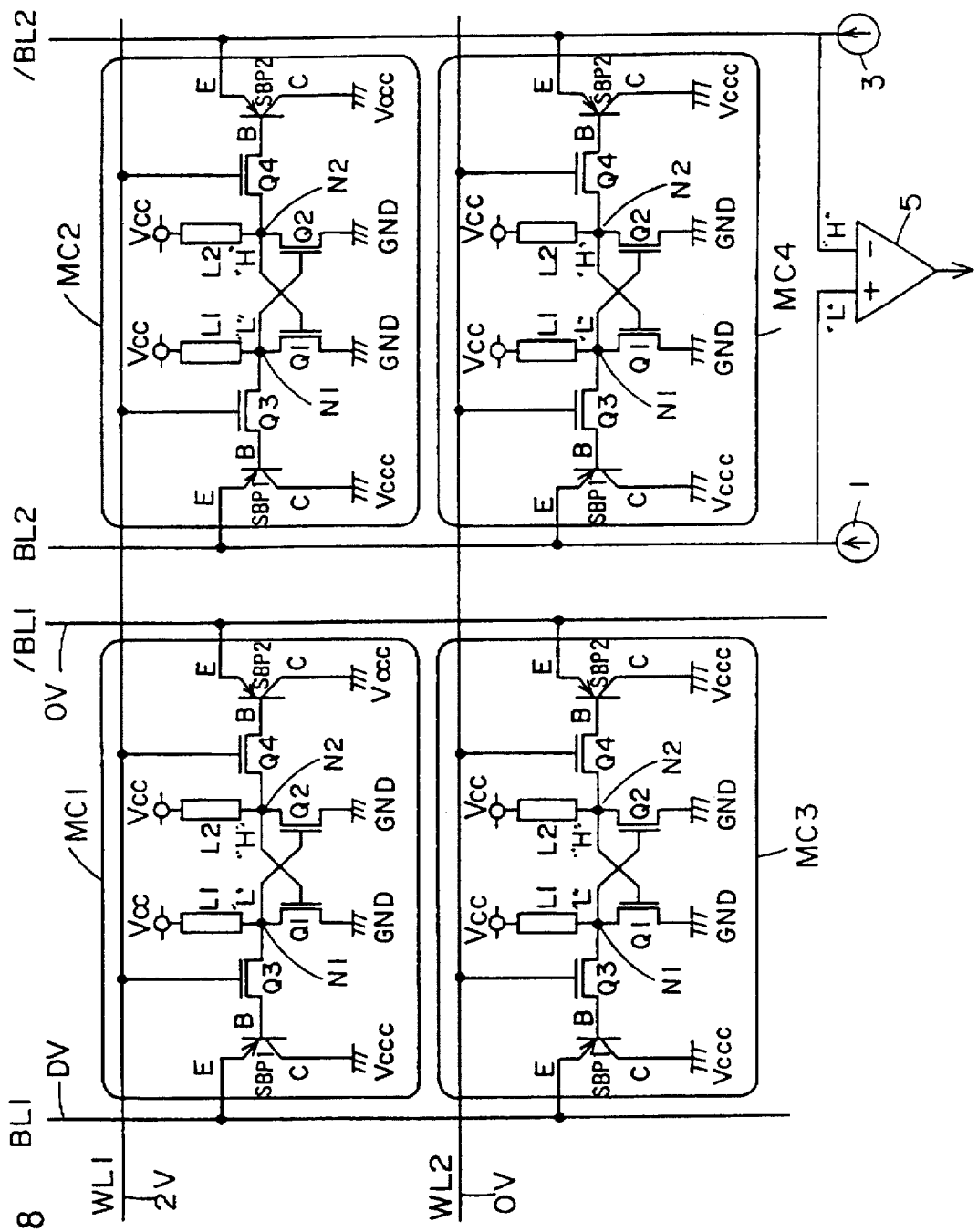
FIG. 18 shows reading operation of the SRAM in accordance with the sixth embodiment of the present invention.

FIG. 17 shows writing operation of the SRAM in accordance with the sixth embodiment. Portions similar to those shown in FIGS. 2 and 16 are denoted by the same reference characters and description thereof is not repeated. Further, the SRAM in accordance with the first embodiment differs only in the structure of the bipolar transistors in the memory cells from the SRAM of the sixth embodiment. Writing operation of the SRAM in accordance with the sixth embodiment is similar to the writing operation of the SRAM in accordance with the first embodiment. FIG. 18 shows reading operation of the SRAM in accordance with the sixth embodiment. Portions similar to those shown in FIGS. 3 and 16 are denoted by the same reference characters and description thereof is not repeated. The reading operation of the SRAM in accordance with the sixth embodiment is similar to the reading operation of the SRAM in accordance with the first embodiment. The plan view showing up to the gates (FIG. 16) of access transistors Q3 and Q4 and driver transistors Q1 and Q2 of the memory cells in accordance with the sixth embodiment is similar to the plan view of FIG. 10. The plan view showing up to the load elements L1 and L2 (FIG. 16) of the memory cells of the SRAM in accordance with the sixth embodiment is similar to the plan view of FIG. 11. The plan view showing up to the bit line pair BL, /BL (FIG. 16) connected to the memory cells of the SRAM in accordance with the sixth embodiment is similar to the plan view of FIG. 12.

Figure 19:
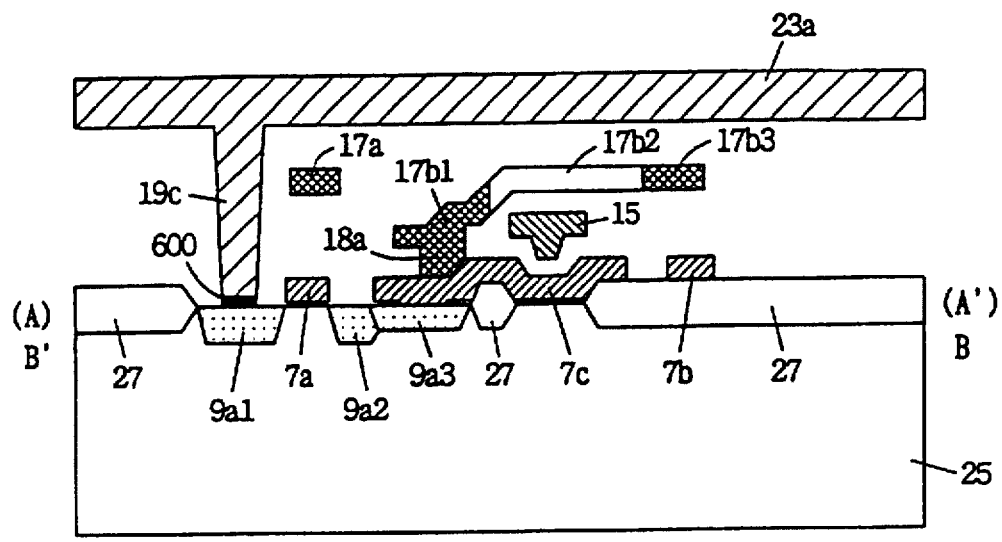
FIG. 19 is a cross section taken along the lines AA' and BB' of FIG. 12, showing the sixth embodiment of the present invention.

FIG. 19 is a cross section taken along the lines AA' and BB' of FIG. 12 showing the sixth embodiment. Portions similar to those of FIG. 13 are denoted by the same reference characters and description thereof is not repeated. Now, the cross section taken along the line AA' is the same as the cross section taken along the line BB' rotated by 180° about the center of the memory cell. Therefore, in the following, cross section taken along the line BB' will be referred to.

Referring to FIG. 19, on a surface of one of the source/drain regions 9a1 of access transistor Q4, emitter 600 of bipolar transistor SBP2 is formed. As will be described in detail later, emitter 600 is formed of silicide. One of the source/drain regions 9a1 of access transistor Q4 serves as the base of bipolar transistor SBP2. Regions 9a1 is also one of the source/drain of access transistor Q4, and it is also the base of bipolar transistor SBP2. Silicon substrate 25 is used as collector C of bipolar transistor SBP2. More specifically, backgate terminal of driver transistors Q1, Q2 and access transistors Q3, Q4 is the collector C of bipolar transistor SBP2. Metal interconnection 23a and emitter 600 of bipolar transistor SBP2 are connected by a metal formed in a second contact hole 19c. As described above, bipolar transistor SBP2 is formed below contact hole 19c (when viewed with metal interconnection 23a at the upper side and silicon substrate 25 at the lower side), in longitudinal direction (vertical to the main surface of silicon substrate 25).

The method of manufacturing bipolar transistors SBP1 and SBP2 (FIG. 16) will be described in detail. FIGS. 20 to 24 show steps of manufacturing bipolar transistors SBP1 and SBP2. Portions similar to those of FIG. 19 are denoted by the same reference characters and description thereof is not repeated.

Figure 20:
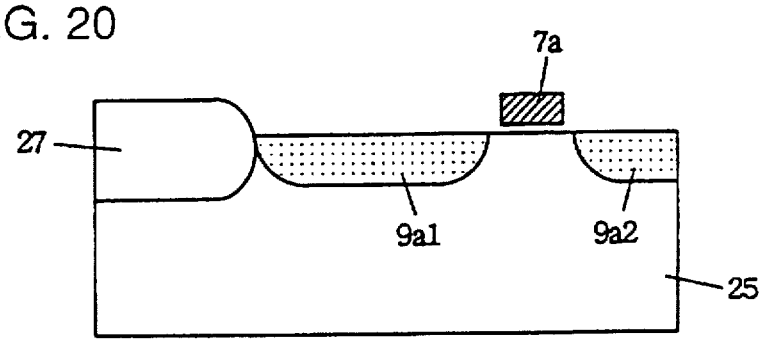
FIGS. 20 to 24 are illustrations showing the method of manufacturing a bipolar transistor included in the memory cell of the SRAM in accordance with the sixth embodiment of the present invention.
Figure 21:
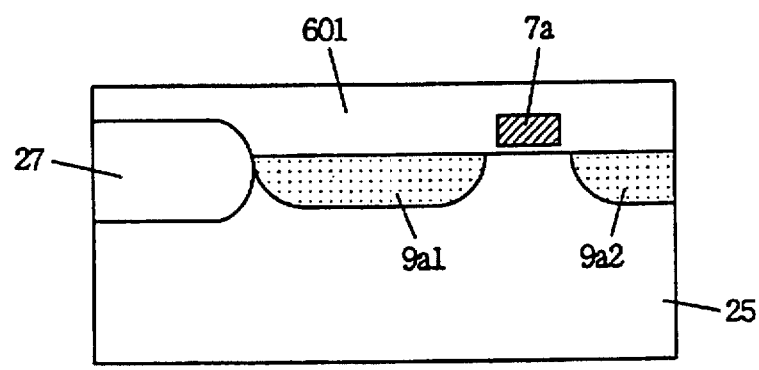
Figure 22:
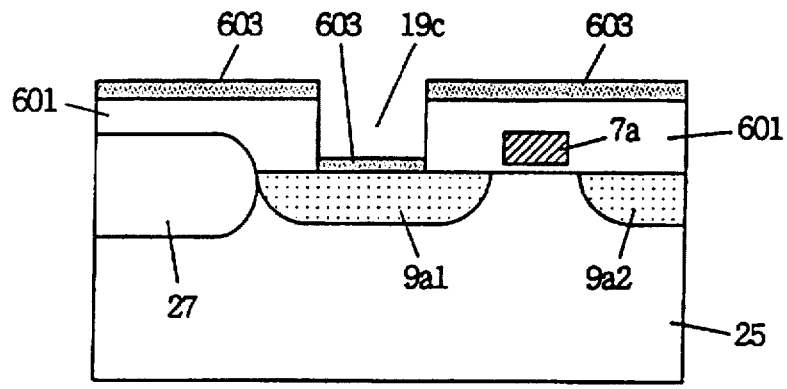
Figure 23:
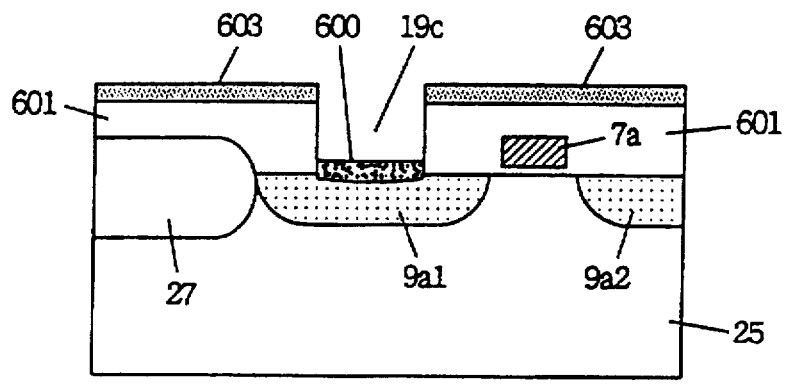
Figure 24:
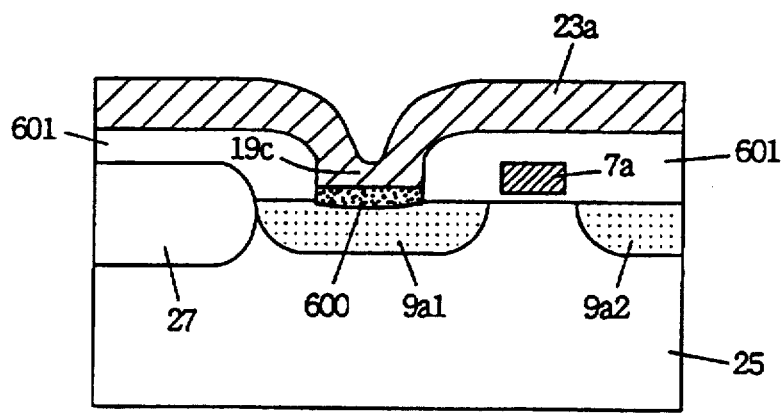

Referring to FIG. 20, at the main surface of silicon substrate 25, one and the other of the source/drain regions 9a1 and 9a2 of access transistor Q4 are formed, and on silicon substrate 25, a gate (first polysilicon) 7a is formed. Regions 9a1 and 9a2 are N$^+$ doped regions. Silicon substrate 25 is of P type. As a next step, referring to FIG. 21, an insulating layer 601 is formed on the main surface of silicon substrate 25. The insulating layer 601 is, for example, an oxide film. As a next step, referring to FIG. 22, contact hole 19c is formed. On insulating layer 601 and source/drain region 9a1, metal 603 is vapor-deposited. Metal 603 is, for example, platinum (Pt). As a next step, referring to FIG. 23, heat treatment is performed by lamp annealing, for example, so as to cause reaction between metal 603 and silicon forming regions 9a1, so that silicide 600 is formed, which will be the emitter of bipolar transistor SBP2. Here, if the vapor-deposited metal 603 is platinum (Pt), platinum silicide (PtSi) is formed. Further, metal 603 on regions 9a1 is not always turned to silicide 600 entirely, and portions apart from region 9a1 may not be turned to silicide. As a next step, referring to FIG. 24, metal 603 on insulating layer 601 which has not turned to silicide is removed. Then, metal interconnection (bit line /BL) 23a is formed. Metal interconnection 23a is, for example, aluminum interconnection. Metal interconnection 23a and silicide 600 are connected by a metal formed in contact hole 19c.

In this manner, bipolar transistor SBP2 having silicide 600 as an emitter, region 9a1 as the base and silicon substrate 25 as the collector is manufactured. Bipolar transistor SBP1 is manufactured in the similar manner.

Now, junction between silicide 600 as the emitter of bipolar transistor SBP2 and region 9a1 as the base of bipolar transistor SBP2 is a Schottky junction. Namely, there is a contact potential difference at the interface between silicide 600 and region 9a1. As compared with a PN junction formed by impurity diffusion into the silicon substrate, Schottky junction allows a large current to flow with smaller forward voltage. Therefore, a bipolar transistor having a Schottky junction allows a large current to flow with smaller emitter-base voltage as compared with a bipolar transistors formed by silicon (PN junction).

As described above, the memory cell of the SRAM in accordance with the sixth embodiment differs from the memory cell of the SRAM in accordance with the first and fourth embodiments only in the structure of the bipolar transistor. Therefore, the SRAM in accordance with the sixth embodiment has similar effects as the SRAMs in accordance with the first and fourth embodiments. Further, the memory cell of the SRAM in accordance with the sixth embodiment has a bipolar transistor having a Schottky junction. Therefore, in the memory cell of the SRAM in accordance with the sixth embodiment, it is possible to cause a large emitter current to flow with small emitter-base voltage. Therefore, in the SRAM in accordance with the sixth embodiment, even when the applied power supply potential is low, malfunction can be prevented. Namely, operation is possible with low power supply potential.

Further, in the SRAM in accordance with the sixth embodiment also, it is possible to provide a high concentration impurity layer in the silicon substrate as shown in FIG. 9. Further, in the SRAM in accordance with the sixth embodiment, the threshold value of the access transistor can be set similar to the SRAM in accordance with the second embodiment. Further, the memory cell shown in FIG. 16 may be used as the memory cell MC shown in FIG. 14.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device, comprising:
   a memory cell storing information,
   said memory cell including
   first load means provided between a node having a first power supply potential and a first storage node,
   second load means provided between a node having said first power supply potential and a second storage node,
   a first MOS transistor provided between said first storage node and a node having a second power supply potential, and having a gate connected to said second storage node,
   a second MOS transistor connected between said second storage node and a node having said second power supply potential, and having a gate connected to said first storage node,
   a first bipolar transistor provided between one of a paired bit lines and a node having a third power supply potential,
   a second bipolar transistor provided between the other one of said paired bit lines and a node having said third power supply potential,
   a third MOS transistor provided between the base of said first bipolar transistor and said first storage node, and having a gate connected to a word line, and
   a fourth MOS transistor provided between the base of said second bipolar transistor and said second storage node, and having a gate connected to said word line, wherein
- said first MOS transistor has a channel width W1 and a channel length L1,
- said second MOS transistor has a channel width W2 and a channel length L2,
- said third MOS transistor has a channel width W3 and a channel length L3, and
- said fourth MOS transistor has a channel width W4 and a channel length L4, where (W1/L1)/(W3/L3) and (W2/L2)/(W4/L4) are approximately 1 or smaller than 1.

2. A static semiconductor memory device, comprising:
a memory cell storing information,
said memory cell including
- first load means Provided between a node having a first power supply potential and a first storage node,
- second load means provided between a node having said first power supply potential and a second storage node,
- a first MOS transistor provided between said first storage node and a node having a second power supply potential, and having a gate connected to said second storage node,
- a second MOS transistor connected between said second storage node and a node having said second power supply potential, and having a gate connected to said first storage node,
- a first bipolar transistor provided between one of a paired bit lines and a node having a third power supply potential,
- a second bipolar transistor provided between the other one of said paired bit lines and a node having said third power supply potential,
- a third MOS transistor provided between the base of said first bipolar transistor and said first storage node, and having a gate connected to a word line, and
- a fourth MOS transistor provided between the base of said second bipolar transistor and said second storage node, and having a gate connected to said word line, wherein
- said first, second, third and fourth MOS transistors, and said first and second bipolar transistors are formed at a main surface of a semiconductor substrate,
- one of source/drain of said third MOS transistor functions as the base of said first bipolar transistor,
- emitter of said first bipolar transistor is formed in said one of source/drain regions of said third MOS transistor,
- collector of said first bipolar transistor is a backgate terminal of said first, second, third and fourth MOS transistors,
- one of source/drain of said fourth MOS transistor functions as the base of said second bipolar transistor,
- emitter of said second bipolar transistor is formed in said one of source/drain regions of said fourth MOS transistor, and
- collector of said second bipolar transistor is said backgate terminal.

3. The static semiconductor memory device according to claim 2, wherein
said first and second load means are formed on said main surface of said semiconductor substrate with an insulating layer interposed.

4. The static semiconductor memory device according to claim 1, wherein
- said first bipolar transistor has the emitter connected to said one of the bit lines through an interconnection layer different from an interconnection layer in which said bit line pair is formed, and
- said second bipolar transistor has the emitter connected to said the other one of the bit lines through said interconnection layer different from said interconnection layer in which said bit line pair is formed.

5. The static semiconductor memory device according to claim 2, wherein
a high concentration impurity layer for supplying said third power supply potential to said collectors of said first and second bipolar transistors is formed in said semiconductor substrate as said backgate terminal.

6. A static semiconductor memory device, comprising:
a memory cell storing information,
said memory cell including
- first load means provided between a node having a first power supply potential and a first storage node,
- second load means provided between a node having said first power supply potential and a second storage node,
- a first MOS transistor provided between said first storage node and a node having a second power supply potential, and having a gate connected to said second storage node,
- a second MOS transistor connected between said second storage node and a node having said second power supply potential, and having a gate connected to said first storage node,
- a first bipolar transistor provided between one of a paired bit lines and a node having a third power supply potential,
- a second bipolar transistor provided between the other one of said paired bit lines and a node having said third power supply potential,
- a third MOS transistor provided between the base of said first bipolar transistor and said first storage node, and having a gate connected to a word line, and
- a fourth MOS transistor provided between the base of said second bipolar transistor and said second storage node, and having a gate connected to said word line, wherein
- said first, second, third and fourth MOS transistors and said first and second bipolar transistors are formed at the main surface of the semiconductor substrate,
- junction between the base and the emitter of said first bipolar transistor is a Schottky junction,
- junction between the base and the emitter of said second bipolar transistor is a Schottky junction,
- one of source/drain of said third MOS transistor functions as the base of said first bipolar transistor,
- the collector of said first bipolar transistor serves as a backgate terminal of said first, second, third and fourth MOS transistors,
- one of the source/drain of said fourth MOS transistors functions as the base of said second bipolar transistor, and
- the collector of said second bipolar transistor is said backgate terminal.

7. The static semiconductor memory device according to claim 6, wherein
said first and second load means are formed on said main surface of said semiconductor substrate with an insulating layer interposed therebetween.

8. The static semiconductor memory device according to claim 6, wherein
- a high concentration impurity layer for supplying said third power supply potential to the collectors of said first and second bipolar transistors is formed in said semiconductor substrate as said backgate terminal.

9. A static semiconductor memory device comprising:
- a memory cell storing information, said memory cell including
- first load means provided between a node having a first power supply potential and a first storage node,
- second load means provided between a node having said first power supply potential and a second storage node,
- a first MOS transistor Provided between said first storage node and a node having a second power supply potential, and having a gate connected to said second storage node,
- a second MOS transistor connected between said second storage node and a node having said second power supply potential, and having a gate connected to said first storage node,
- a first bipolar transistor provided between one of a paired bit lines and a node having a third power supply potential,
- a second bipolar transistor provided between the other one of said paired bit lines and a node having said third power supply potential,
- a third MOS transistor provided between the base of said first bipolar transistor and said first storage node, and having a gate connected to a word line, and
- a fourth MOS transistor provided between the base of said second bipolar transistor and said second storage node, and having a gate connected to said word line, wherein
- said third MOS transistor has a threshold voltage smaller in absolute value than the threshold voltage of said first MOS transistor, and
- said fourth MOS transistor has a threshold voltage smaller in absolute value than the threshold voltage of said second MOS transistor.

10. A static semiconductor memory device, comprising:
- a memory cell storing information, said memory cell including
- first load means provided between a node having a first power supply potential and a first storage node,
- second load means provided between a node having said first power supply potential and a second storage node,
- a first MOS transistor provided between said first storage node and a node having a second power supply potential, and having a gate connected to said second storage node,
- a second MOS transistor connected between said second storage node and a node having said second power supply potential, and having a gate connected to said first storage node,
- a first bipolar transistor provided between one of a paired bit lines and a node having a third power supply potential,
- a second bipolar transistor provided between the other one of said paired bit lines and a node having said third power supply potential,
- a third MOS transistor provided between the base of said first bipolar transistor and said first storage node, and having a gate connected to a word line, and
- a fourth MOS transistor provided between the base of said second bipolar transistor and said second storage node, and having a gate connected to said word line, wherein
- voltage when said bit line pair is precharged during reading operation is larger than a voltage between emitter and base of each of said first and second bipolar transistors when said first and second bipolar transistors are conducted.

* * * * *